US012707945B2

(12) United States Patent
Lee et al.

(10) Patent No.: US 12,707,945 B2
(45) Date of Patent: Aug. 11, 2026

(54) SEMICONDUCTOR DEVICE

(71) Applicant: SAMSUNG ELECTRONICS CO., LTD., Suwon-si (KR)

(72) Inventors: Jang Ho Lee, Suwon-si (KR); Woo Kyung You, Suwon-si (KR); Jong Min Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 705 days.

(21) Appl. No.: 17/968,050

(22) Filed: Oct. 18, 2022

(65) Prior Publication Data

US 2023/0307370 A1 Sep. 28, 2023

(30) Foreign Application Priority Data

Mar. 28, 2022 (KR) ........................ 10-2022-0037860

(51) Int. Cl.
*H10W 20/41* (2026.01)
*H10W 20/00* (2026.01)
(Continued)

(52) U.S. Cl.
CPC ....... *H10W 20/075* (2026.01); *H10W 20/033* (2026.01); *H10W 20/0698* (2026.01); *H10W 20/077* (2026.01); *H10W 20/089* (2026.01); *H10W 20/42* (2026.01); *H10W 20/425* (2026.01); *H10W 20/435* (2026.01); *H10W 20/455* (2026.01); *H10W 20/47* (2026.01)

(58) Field of Classification Search
CPC ........... H01L 23/5283; H01L 21/76832; H01L 23/5226; H10W 20/075; H10W 20/42; H10W 20/435
See application file for complete search history.

(56) References Cited

U.S. PATENT DOCUMENTS 6,740,976 B2 5/2004 Lee
7,511,349 B2 3/2009 Tsai et al.
(Continued)

FOREIGN PATENT DOCUMENTS

KR 10-2732300 B1 11/2024

OTHER PUBLICATIONS

Communication dated Sep. 24, 2025 issued by the Korean Intellectual Patent Office in App No. 10-2022-0037860.

*Primary Examiner* — Daniel Luke
(74) *Attorney, Agent, or Firm* — Sughrue Mion, PLLC

(57) ABSTRACT

A semiconductor device is provided. The semiconductor device includes a first interlayer insulating layer, a lower wiring disposed inside the first interlayer insulating layer, an etching stop layer which includes first to third layers sequentially stacked on the first interlayer insulating layer, a second interlayer insulating layer disposed on the etching stop layer, and a via which penetrates the second interlayer insulating layer and the etching stop layer, the via is connected to the lower wiring, the via includes a first side wall that is in contact with the second layer, and a second side wall that is in contact with the second interlayer insulating layer, the via includes a first protrusion protruding in a horizontal direction from the first side wall inside the first layer, and a second protrusion protruding in the horizontal direction from the first side wall inside the third layer.

20 Claims, 26 Drawing Sheets

(51) Int. Cl.

| | |
|---|---|
| ***H10W 20/42*** | (2026.01) |
| ***H10W 20/45*** | (2026.01) |
| ***H10W 20/47*** | (2026.01) |

(56) References Cited

U.S. PATENT DOCUMENTS

| | | | | |
|---|---|---|---|---|
| 7,550,805 | B2 | 6/2009 | Leedy | |
| 7,550,822 | B2 | 6/2009 | Lee et al. | |
| 8,436,404 | B2 | 5/2013 | Bohr et al. | |
| 9,627,318 | B2 | 4/2017 | Lin et al. | |
| 9,711,454 | B2 * | 7/2017 | Fang | H01L 23/5329 |
| 9,871,116 | B2 | 1/2018 | Basker et al. | |
| 10,468,297 | B1 | 11/2019 | Tung et al. | |
| 10,497,649 | B2 * | 12/2019 | Bark | H01L 23/5283 |
| 10,727,178 | B2 | 7/2020 | Chang et al. | |
| 10,854,505 | B2 | 12/2020 | Chen et al. | |
| 10,854,506 | B2 * | 12/2020 | Liang | H10D 64/679 |
| 10,923,420 | B2 * | 2/2021 | Oh | H01L 21/76834 |
| 12,068,253 | B2 * | 8/2024 | Li | H01L 23/5283 |
| 2007/0085209 | A1 * | 4/2007 | Lu | H01L 21/76802<br>257/E23.145 |
| 2017/0062343 | A1 | 3/2017 | Fang et al. | |
| 2021/0005548 | A1 * | 1/2021 | Lee | H01L 23/5226 |
| 2022/0293520 | A1 * | 9/2022 | Huang | H01L 21/76834 |

* cited by examiner

SEMICONDUCTOR DEVICE

CROSS-REFERENCE TO RELATED APPLICATION

This application claims priority from Korean Patent Application No. 10-2022-0037860 filed on Mar. 28, 2022 in the Korean Intellectual Property Office, the disclosures of which are incorporated by reference herein in its entirety.

BACKGROUND

1. Technical Field

Embodiments of the present disclosure relate to a semiconductor device.

2. Description of Related Art

As down-scaling of semiconductor elements has progressed rapidly in recent years due to development of electronic technology, there has been a demand for high integration and lower power consumption of semiconductor chips. Accordingly, an interval between circuit components such as wirings is gradually reduced, which may cause a problem such as leakage. Further, an aspect ratio of the wiring layer increases for the high integration and low power consumption of the semiconductor chips. Various studies for forming a wiring layer having an increased aspect ratio not to include defects are being conducted.

SUMMARY

One or more embodiments provide a semiconductor device which prevents a via from peeling off from an etching stop layer, by forming each of a width of the via disposed inside a lowermost layer of the etching stop layer and a width of the via disposed inside an uppermost layer of the etching stop layer to be greater than the width of the via disposed inside an intermediate layer of the etching stop layer, inside the etching stop layer formed of triple films.

According to an aspect of an embodiment, there is provided a semiconductor device including a first interlayer insulating layer, a lower wiring disposed inside the first interlayer insulating layer, an etching stop layer disposed on the first interlayer insulating layer, the etching stop layer including a first layer, a second layer, and a third layer, a second interlayer insulating layer disposed on the etching stop layer, and a via penetrating the second interlayer insulating layer and the etching stop layer and being connected to the lower wiring, the via including a first side wall that is in contact with the second layer, a second side wall that is in contact with the second interlayer insulating layer, a first protrusion protruding in a horizontal direction from the first side wall inside the first layer, and a second protrusion protruding in the horizontal direction from the first side wall inside the third layer.

According to another aspect of an embodiment, there is provided a semiconductor device including a first interlayer insulating layer, a lower wiring disposed inside the first interlayer insulating layer, an etching stop layer disposed on the first interlayer insulating layer, the etching stop layer including a first layer, a second layer, and a third layer, a second interlayer insulating layer disposed on the etching stop layer, and a via including a first portion disposed inside the first layer, a second portion disposed inside the second layer, a third portion disposed inside the third layer, and a fourth portion disposed inside the second interlayer insulating layer, wherein a width of the third portion in a horizontal direction is greater than a width of the first portion in the horizontal direction, wherein the width of the first portion in the horizontal direction is greater than a width of the second portion in the horizontal direction, and wherein each of at least a part of an upper surface of the first portion and at least a part of a lower surface of the third portion is in contact with the second layer.

According to another aspect of an embodiment, there is provided a semiconductor device including a substrate, a first interlayer insulating layer disposed on the substrate, a lower wiring disposed inside the first interlayer insulating layer, an etching stop layer disposed on the first interlayer insulating layer, the etching stop layer including a first layer, a second layer, and a third layer respectively including an aluminum compound, a second interlayer insulating layer disposed on the etching stop layer, a via penetrating the second interlayer insulating layer and the etching stop layer and being connected to the lower wiring, the via including a first portion disposed inside the first layer, a second portion disposed inside the second layer, a third portion disposed inside the third layer, a fourth portion disposed inside the second interlayer insulating layer, a first protrusion protruding in a horizontal direction from a side wall of the second portion inside the first layer, and a second protrusion protruding in the horizontal direction from a side wall of the second portion inside the third layer, and an upper wiring disposed on the via and connected to the via, a width of the upper wiring in the horizontal direction being greater than a width of the via in the horizontal direction, wherein a first length of the first protrusion in the horizontal direction is smaller than a second length of the second protrusion in the horizontal direction, wherein each of an upper surface of the first protrusion and a lower surface of the second protrusion is in contact with the second layer, and wherein an upper surface of the second protrusion is in contact with the second interlayer insulating layer.

BRIEF DESCRIPTION OF THE DRAWINGS

The above and other aspects and features of the present disclosure will become more apparent by describing in detail embodiments thereof referring to the attached drawings, in which:

FIGS. 3 to 10 are intermediate step diagrams illustrating a method for fabricating the semiconductor device shown in FIGS. 1 and 2;

FIG. 13 is an enlarged view of a B region of FIG. 1;

DETAILED DESCRIPTION

Below, embodiments of the present disclosure will be described in detail and clearly to such an extent that one skilled in the art easily carries out the present disclosure. Embodiments described herein are example embodiments, and thus, the disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Hereinafter, a semiconductor device according to some embodiments will be described referring to FIGS. 1 and 2.

Figure 1:
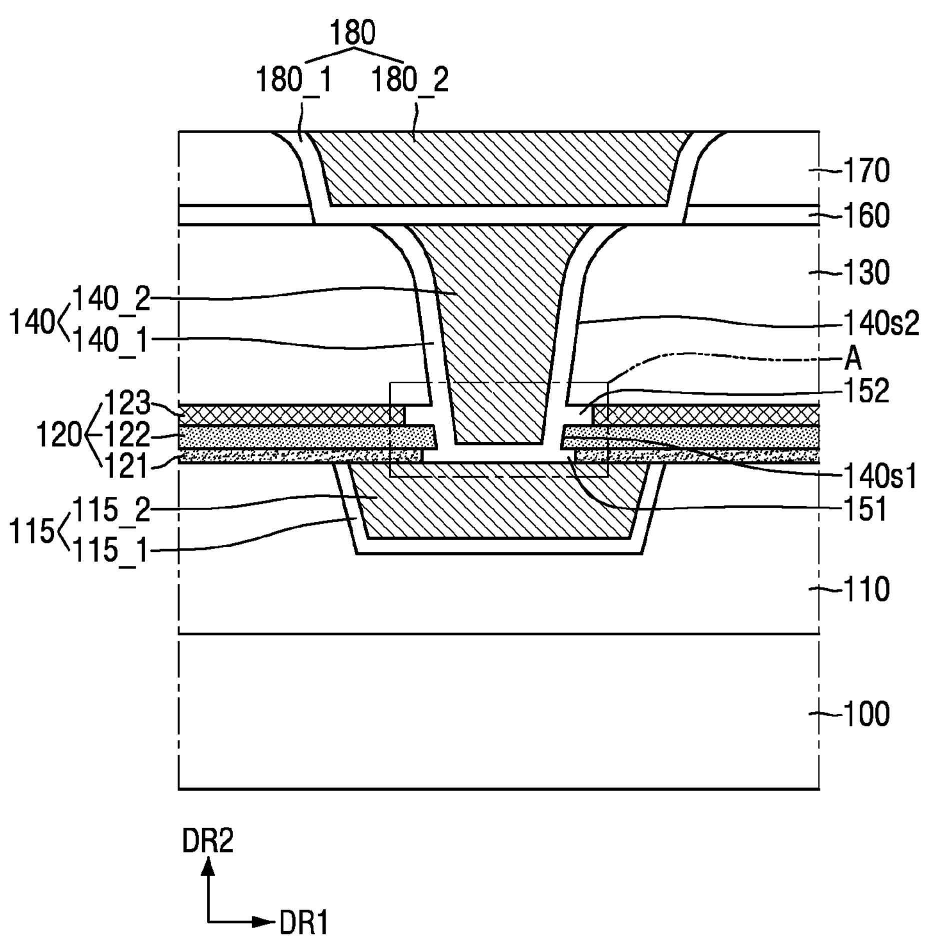
FIG. 1 is a cross-sectional view illustrating a semiconductor device according to some embodiments.

FIG. 1 is a cross-sectional view illustrating a semiconductor device according to some embodiments. FIG. 2 is an enlarged view of the region A of FIG. 1.

Figure 2:
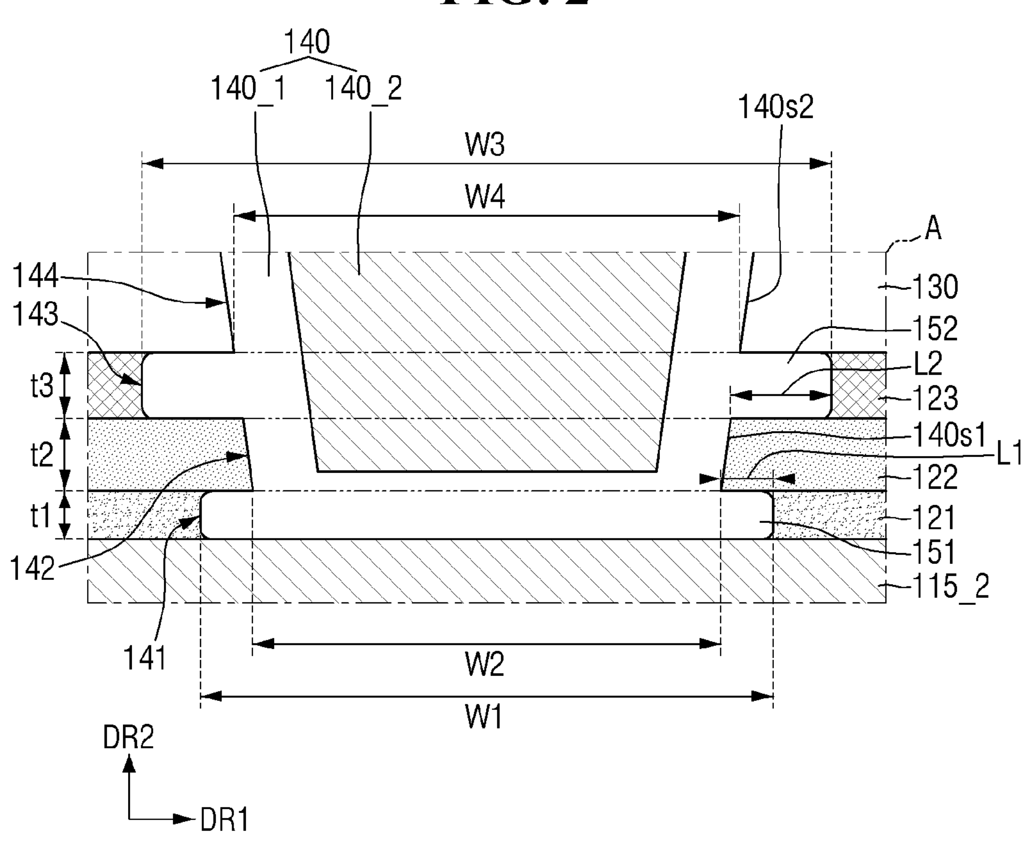
FIG. 2 is an enlarged view of a region A of FIG. 1.

Referring to FIGS. 1 and 2, the semiconductor device according to some embodiments includes a substrate 100, a first interlayer insulating layer 110, a lower wiring 115, a first etching stop layer 120, a second interlayer insulating layer 130, a via 140, a second etching stop layer 160, a third interlayer insulating layer 170, and an upper wiring 180.

Although the substrate 100 may have a structure in which a base substrate and an epitaxial layer are stacked, embodiments are not limited thereto. The substrate 100 may be a silicon substrate, a gallium arsenide substrate, a silicon germanium substrate, a ceramic substrate, a quartz substrate, a glass substrate for a display, or the like, or may be a semiconductor on insulator (SOI) substrate.

Further, the substrate 100 may include a conductive pattern. The conductive pattern may be a metal wiring, a contact, or the like, or may be a gate electrode of a transistor, a source/drain of a transistor, a diode, or the like, but embodiments are not limited thereto.

The first interlayer insulating layer 110 may be disposed on the substrate 100. The first interlayer insulating layer 110 may include, for example, at least one of a silicon oxide, a silicon nitride, a silicon oxynitride, and a low dielectric constant material. The first interlayer insulating layer 110 may include a relatively low dielectric constant material to reduce a coupling shape between the wirings.

The lower wiring 115 may be disposed inside the first interlayer insulating layer 110. For example, an upper surface of the lower wiring 115 may be coplanar as the upper surface of the first interlayer insulating layer 110. However, embodiments are not limited thereto.

The lower wiring 115 may include a first barrier layer 115_1 and a first filling layer 115_2. The first barrier layer 115_1 may form side walls and a bottom surface of the lower wiring 115. The first barrier layer 115_1 may be in contact with the first interlayer insulating layer 110. The first barrier layer 115_1 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobide nitride (NbN), and combinations thereof. However, embodiments are not limited thereto.

The first filling layer 115_2 may be disposed on the first barrier layer 115_1. For example, the upper surface of the first filling layer 115_2 may be coplanar as the upper surface of the first interlayer insulating layer 110. The first filling layer 115_2 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and rhodium (Rh). However, embodiments are not limited thereto.

The first etching stop layer 120 may be disposed on the first interlayer insulating layer 110 and the lower wiring 115. For example, the first etching stop layer 120 may be in contact with each of the upper surface of the first interlayer insulating layer 110 and the upper surface of the lower wiring 115. The first etching stop layer 120 may include a first layer 121, a second layer 122, and a third layer 123 that are sequentially stacked on the first interlayer insulating layer 110 and the lower wiring 115 in a vertical direction DR2. Here, the vertical direction DR2 may be a direction perpendicular to the upper surface of the substrate 100.

A first layer 121 may be disposed on the first interlayer insulating layer 110 and the lower wiring 115. For example, the first layer 121 may be conformally formed. The first layer 121 may include an aluminum compound. For example, the first layer 121 may include aluminum oxide ($Al_2O_3$) or aluminum nitride (AlN). However, embodiments are not limited thereto, and in some other embodiments, the first layer 121 may include hafnium oxide ($Hf_2O_3$) or zirconium oxide ($Zr_2O_3$).

A second layer 122 may be disposed on the first layer 121. For example, the second layer 122 may be conformally formed. For example, the second layer 122 may include any one of silicon oxycarbide (SiOC), silicon carbide (SiC), and silicon oxide ($SiO_2$).

A third layer 123 may be disposed on the second layer 122. For example, the third layer 123 may be conformally formed. The third layer 123 may include an aluminum compound. For example, the third layer 123 may include aluminum oxide ($Al_2O_3$) or aluminum nitride (AlN). However, embodiments are not limited thereto, and in some other embodiments, the third layer 123 may include hafnium oxide ($Hf_2O_3$) or zirconium oxide ($Zr_2O_3$). For example, the first layer 121 and the third layer 123 may include the same material, but embodiments are not limited thereto. In some other embodiments, the first layer 121 and the third layer 123 may include different materials.

For example, referring to FIG. 2, a thickness t1 of the first layer 121 may range from 10 Å to 50 Å. A thickness t2 of the second layer 122 may range from 10 Å to 100 Å. A thickness t3 of the third layer 123 may range from 10 Å to 50 Å. For example, the thickness t3 of the third layer 123 may be greater than the thickness t1 of the first layer 121. For example, the thickness t2 of the second layer 122 may be greater than the thickness t3 of the third layer 123. However, embodiments are not limited thereto. In some other embodiments, the thickness t2 of the second layer 122 may be the same as the thickness t3 of the third layer 123.

The second interlayer insulating layer 130 may be disposed on the first etching stop layer 120. The second interlayer insulating layer 130 may be in contact with the third layer 123. The second interlayer insulating layer 130 may include, for example, at least one of silicon oxide, silicon nitride, silicon oxynitride and a low dielectric constant material.

A via 140 penetrates the second interlayer insulating layer 130 and the first etching stop layer 120 in the vertical direction DR2 and may be connected to the lower wiring 115. For example, an upper surface of the via 140 may be coplanar as the upper surface of the second interlayer insulating layer 130. For example, the width of the via 140 in the horizontal direction DR1 may be smaller than the width of the lower wiring 115 in the horizontal direction DR1. Here, the horizontal direction DR1 may be a direction parallel to the upper surface of the substrate 100.

The via 140 may include a first portion 141, a second portion 142, a third portion 143, and a fourth portion 144. The first portion 141 of the via 140 may be disposed inside the first layer 121. The first portion 141 of the via 140 may be in contact with the lower wiring 115. The second portion 142 of the via 140 may be disposed inside the second layer 122. The third portion 143 of the via 140 may be disposed inside the third layer 123. The fourth portion 144 of the via 140 may be disposed inside the second interlayer insulating layer 130.

The width W1 in the horizontal direction DR1 of the first portion 141 of the via 140 may be greater than the width W2 in the horizontal direction DR1 of the second portion 142 of the via 140. The width W3 in the horizontal direction DR1 of the third portion 143 of the via 140 may be greater than the width W2 in the horizontal direction DR1 of the second portion 142 of the via 140. The width W3 in the horizontal direction DR1 of the third portion 143 of the via 140 may be greater than the width W1 in the horizontal direction DR1 of the first portion 141 of the via 140. The width W3 in the horizontal direction DR1 of the third portion 143 of the via 140 may be greater than the width W4 in the horizontal direction DR1 of the fourth portion 144 of the via 140 that is in contact with the third portion 143 of the via 140. The width W1 in the horizontal direction DR1 of the first portion 141 of the via 140 may be greater than the width W4 in the horizontal direction DR1 of the fourth portion 144 of the via 140 that is in contact with the third portion 143 of the via 140.

The via 140 may include a first side wall **140*s*1 that is in contact with the second layer 122, and a second side wall 140*s*2 that is in contact with the second interlayer insulating layer 130. For example, an upper portion of the second side wall 140*s*2 of the via 140 may extend to have a curved surface toward the upper surface of the second interlayer insulating layer 130**.

The first portion 141 of the via 140 may include a first protrusion 151 that protrudes from the first side wall **140*s*1 of the via 140 in the horizontal direction DR1. For example, the first protrusion 151 may have an annular shape on a plane in a plan view. The upper surface of the first protrusion 151 may be in contact with the second layer 122. For example, at least a part of the upper surface of the first portion 141 of the via 140 may be in contact with the second layer 122**.

The third portion 143 of the via 140 may include a second protrusion 152 that protrudes from the first side wall **140*s*1 of the via 140 in the horizontal direction DR1. The second protrusion 152 protrudes from the second side wall 140*s*2 of the via 140 adjacent to the third layer 123 in the horizontal direction DR1. For example, the second protrusion 152 may have an annular shape on a plane in a plan view. A lower surface of the second protrusion 152 may be in contact with the second layer 122. For example, at least a part of the lower surface of the third portion 143 of the via 140 may be in contact with the second layer 122. Further, the upper surface of the second protrusion 152 may be in contact with the second interlayer insulating layer 130. For example, at least a part of the upper surface of the third portion 143 of the via 140 may be in contact with the second interlayer insulating layer 130**.

A length L1 of the first protrusion 151 in the horizontal direction DR1 may be smaller than a length L2 of the second protrusion 152 in the horizontal direction DR1. For example, the first length L1 in the horizontal direction DR1 from the first side wall **140*s*1 of the via 140 to the side wall of the first portion 141 of the via 140 may be smaller than the second length L2 in the horizontal direction DR1 from the first side wall 140*s*1 of the via 140 to the side wall of the third portion 143 of the via 140**.

The via 140 may include a second barrier layer 140_1 and a second filling layer 140_2. The second barrier layer 140_1 may form side walls and a bottom surface of the via 140. The second barrier layer 140_1 may be in contact with each of the first filling layer 115_2, the first to third layers 121, 122 and 123, and the second interlayer insulating layer 130. Each of the first protrusion 151 and the second protrusion 152 may include a second barrier layer 140_1. The second barrier layer 140_1 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobide nitride (NbN), and combinations thereof. However, embodiments are not limited thereto.

The second filling layer 140_2 may be disposed on the second barrier layer 140_1. For example, the upper surface of the second filling layer 140_2 may be formed coplanar as the upper surface of the second interlayer insulating layer 130. The second filling layer 140_2 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and rhodium (Rh). However, embodiments are not limited thereto.

The second etching stop layer 160 may be disposed on the second interlayer insulating layer 130 and the via 140. The second etching stop layer 160 may include, for example, at least one of silicon nitride, silicon oxynitride, and silicon carbonitride. Although FIG. 1 shows that the second etching stop layer 160 is formed of a single film, embodiments are not limited thereto. In some other embodiments, the second etching stop layer 160 may be formed of multi-films.

The third interlayer insulating layer 170 may be disposed on the second etching stop layer 160. The third interlayer insulating layer 170 may be in contact with the second etching stop layer 160. The third interlayer insulating layer 170 may include, for example, at least one of a silicon oxide, a silicon nitride, a silicon oxynitride, and a low dielectric constant material.

The upper wiring 180 may be disposed inside each of the second etching stop layer 160 and the third interlayer insulating layer 170. For example, the upper surface of the upper wiring 180 may be coplanar as the upper surface of the third interlayer insulating layer 170. However, embodiments are not limited thereto. For example, the width of the upper wiring 180 in the horizontal direction DR1 may be greater than the width of the via 140 in the horizontal direction DR1.

The upper wiring 180 may include a third barrier layer 180_1 and a third filling layer 180_2. The third barrier layer 180_1 may form side walls and a bottom surface of the upper wiring 180. The third barrier layer 180_1 may be in contact with the second filling layer 140_2. The third barrier layer 180_1 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobide nitride (NbN), and combinations thereof. However, embodiments are not limited thereto.

The third filling layer 180_2 may be disposed on the third barrier layer 180_1. For example, the third barrier layer 180_1 may be disposed between the second filling layer 140_2 and the third filling layer 180_2. For example, the upper surface of the third filling layer 180_2 may be coplanar as the upper surface of the third interlayer insulating layer 170. The third filling layer 180_2 may include, for example, at least one of copper (Cu), carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), zirconium (Zr), tungsten (W), ruthenium (Ru), iridium (Ir), and rhodium (Rh). However, embodiments are not limited thereto.

In the semiconductor device according to embodiments, each of the width of the via 140 disposed inside the lowermost layer 121 of the etching stop layer 120 and the width of the via 140 disposed inside the uppermost layer 123 of the etching stop layer 120 may be formed to be greater than the width of the via 140 disposed inside an intermediate layer 122 of the etching stop layer 120, inside the etching stop layer 120 formed of the three layers. Therefore, the semiconductor device according to embodiments may prevent the via 140 from peeling off from the etching stop layer 120.

Hereinafter, a method for fabricating a semiconductor device according to some embodiments will be described referring to FIGS. 1 and 3 to 10.

FIGS. 3 to 10 are intermediate step diagrams illustrating the method for fabricating the semiconductor device shown in FIGS. 1 and 2.

Figures 3, 4:
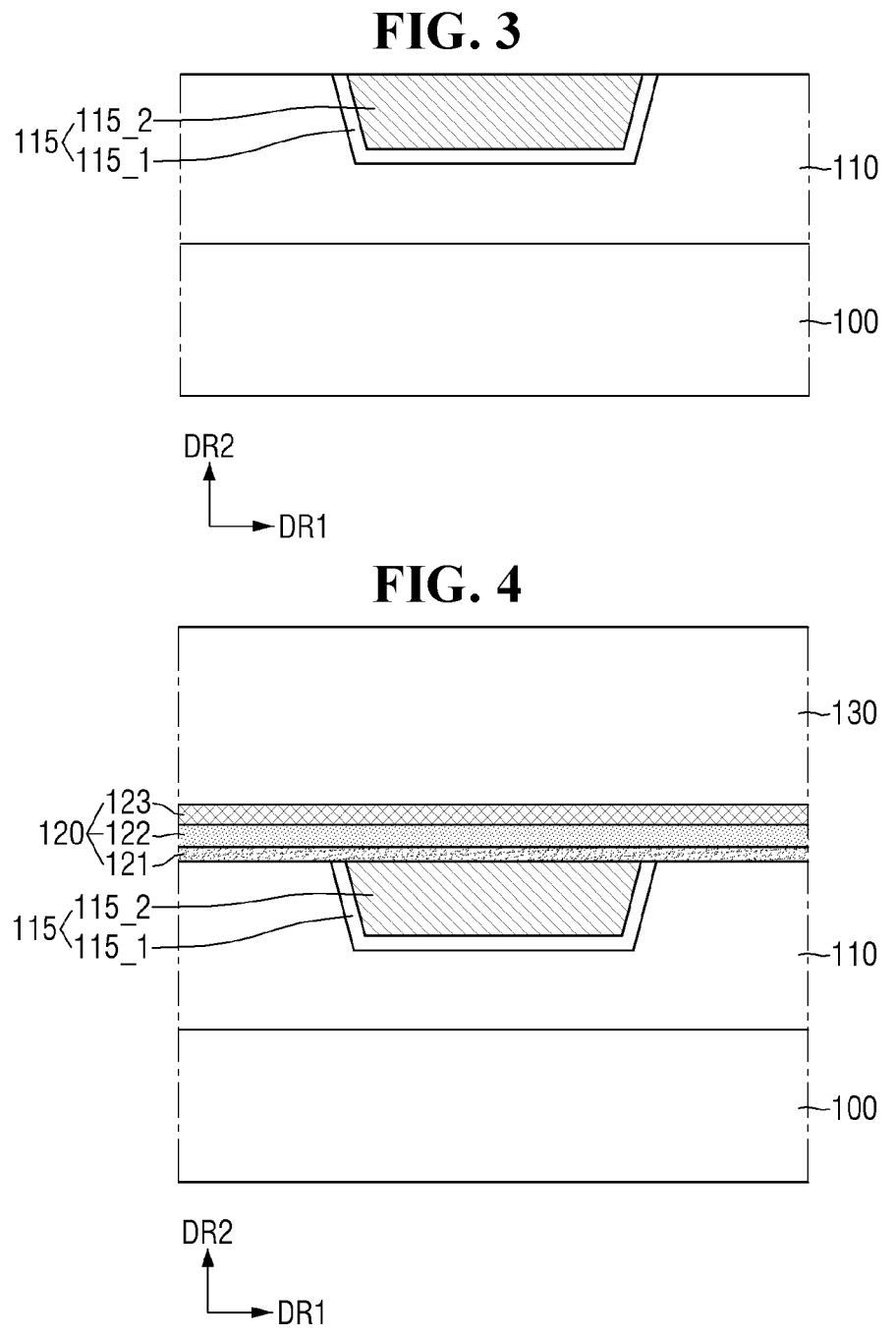

Referring to FIG. 3, the first interlayer insulating layer 110 may be formed on the substrate 100. Subsequently, the lower wiring 115 may be formed inside the first interlayer insulating layer 110. For example, the upper surface of the lower wiring 115 may be formed to be coplanar as the upper surface of the first interlayer insulating layer 110.

Referring to FIG. 4, the first etching stop layer 120 and the second interlayer insulating layer 130 may be sequentially formed on the first interlayer insulating layer 110 and the lower wiring 115. The first etching stop layer 120 may include first to third layers 121, 122, and 123 sequentially formed on the first interlayer insulating layer 110 and the lower wiring 115. The first layer 121 may be in contact with each of the first interlayer insulating layer 110 and the lower wiring 115. The third layer 123 may be in contact with the second interlayer insulating layer 130.

Figure 5:
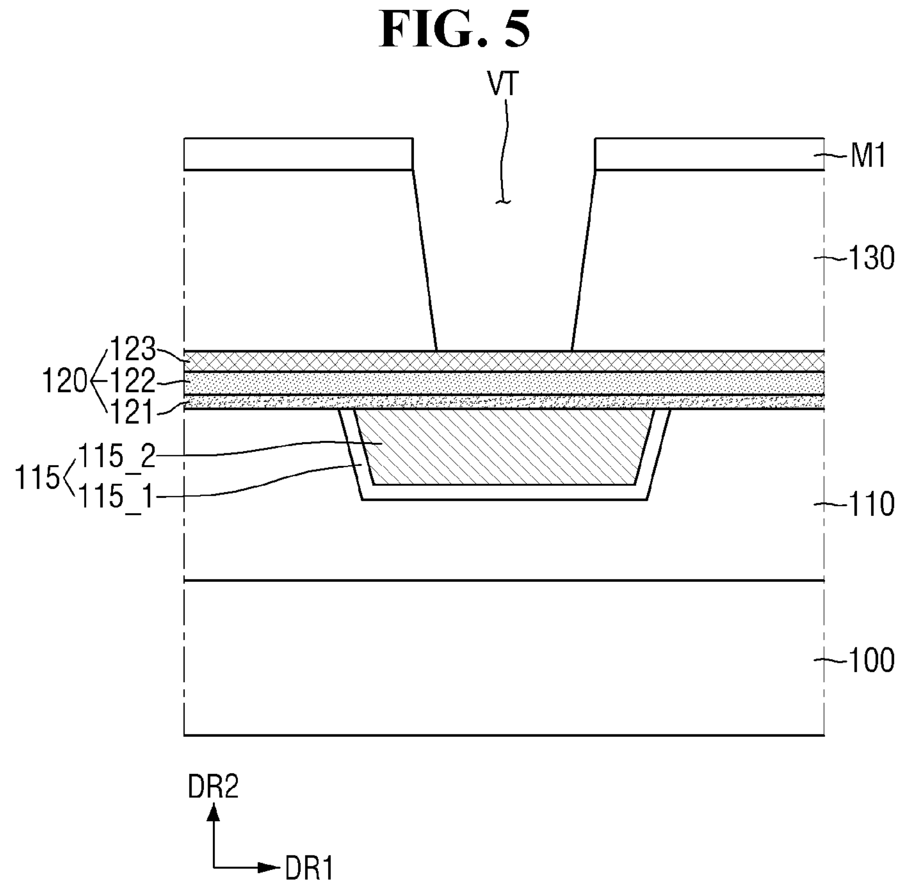

Referring to FIG. 5, a first mask pattern M1 may be formed on the second interlayer insulating layer 130. Subsequently, by etching the second interlayer insulating layer 130 using the first mask pattern M1 as a mask, a via trench VT may be formed. The via trench VT may expose the upper surface of the third layer 123.

Figure 6:
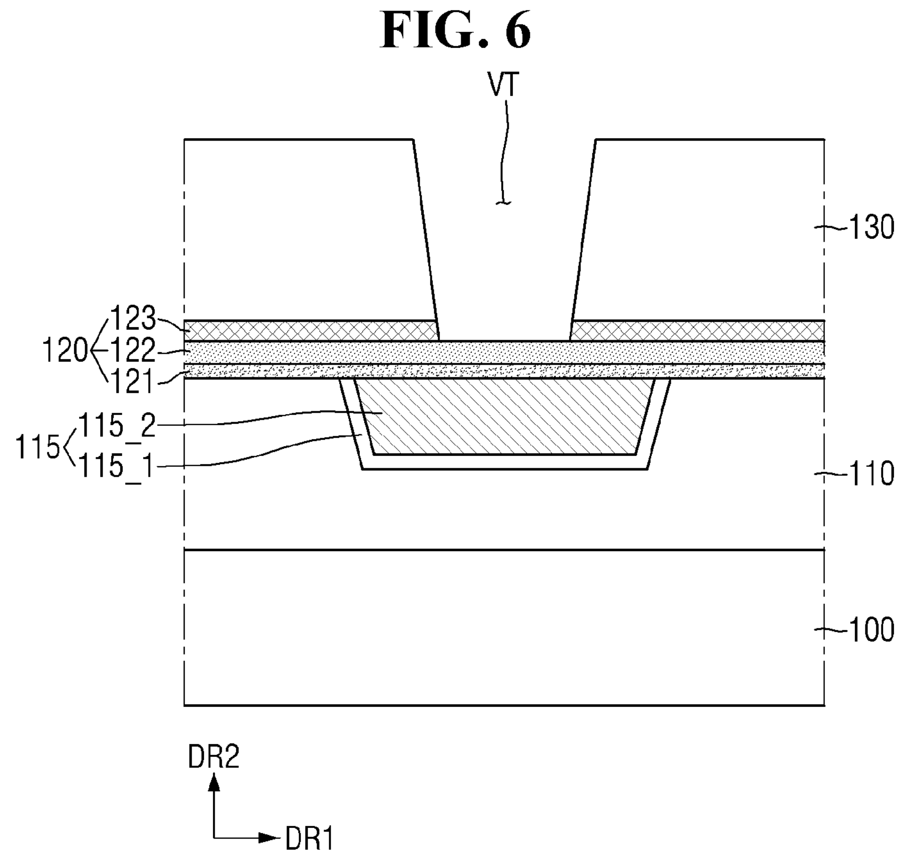

Referring to FIG. 6, the first mask pattern M1 may be removed. In addition, the third layer 123 exposed by the via trench VT may be removed.

Figure 7:
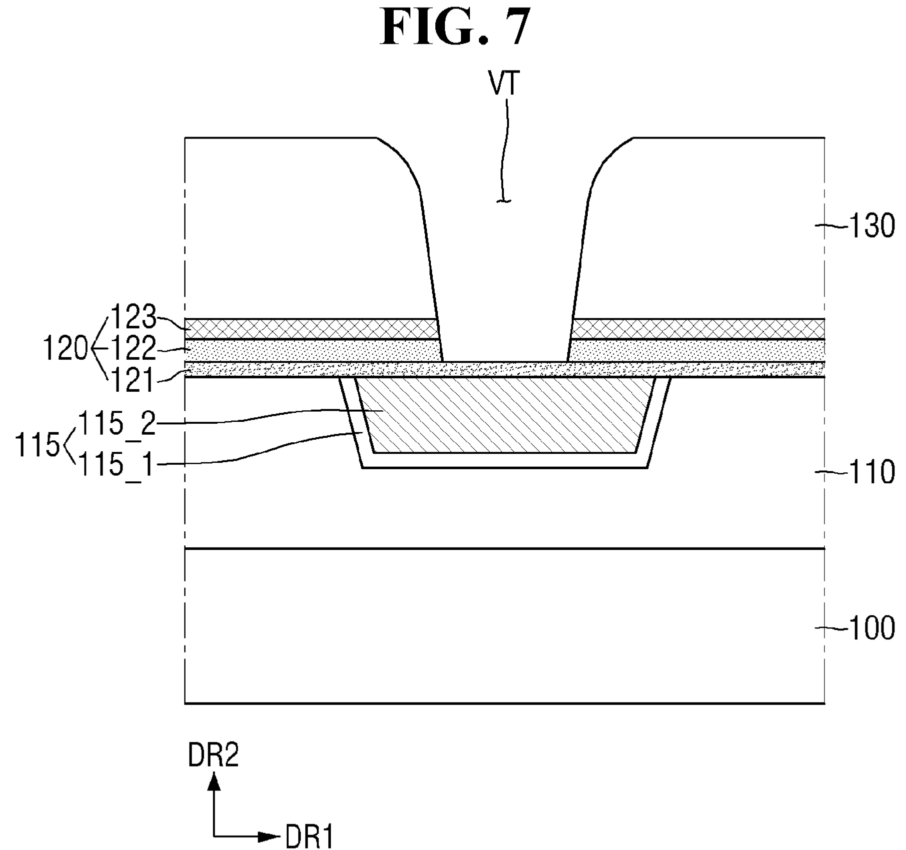

Referring to FIG. 7, the second layer 122 exposed by the via trench VT may be removed. While the second layer 122 is removed, a part of the upper side wall of the via trench VT may be etched. Therefore, a part of the upper side wall of the via trench VT may be formed to have a curved surface toward the upper surface of the second interlayer insulating layer 130.

Figure 8:
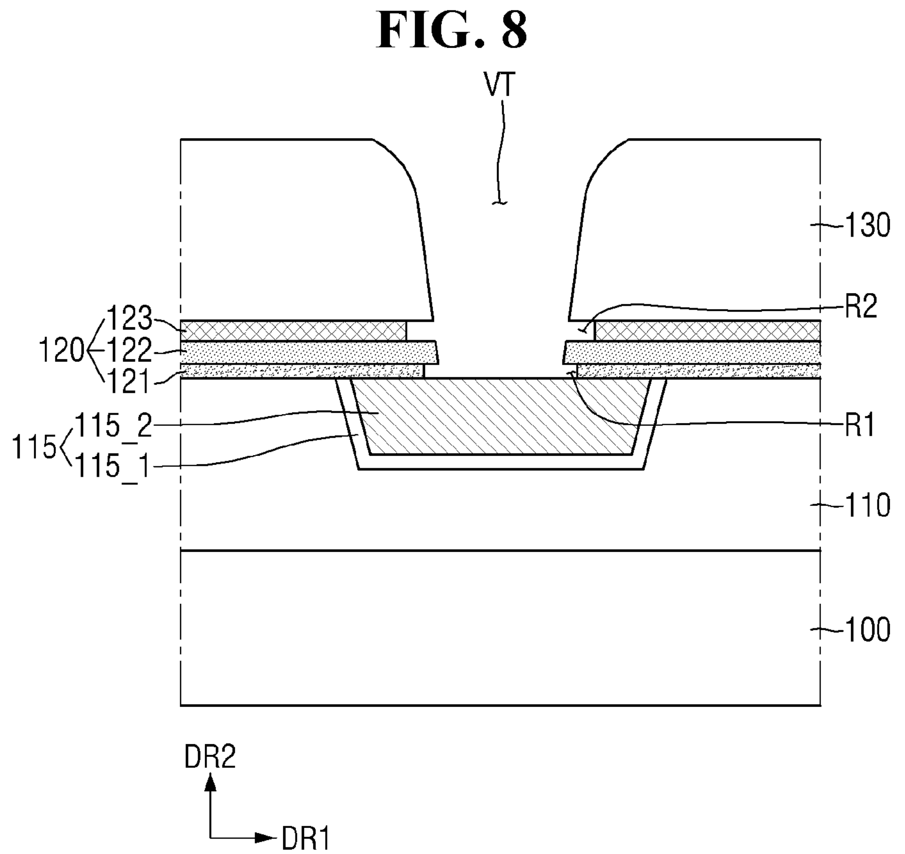

Referring to FIG. 8, a part of the first layer 121 and a part of the third layer 123 exposed by the via trench VT may be removed through, for example the wet etching process. A part of the first layer 121 is removed, and the lower wiring 115 may be exposed by the via trench VT. A part of the first layer 121 is removed, and a first recess R1 formed to protrude between the lower wiring 115 and the second layer 122 may be formed. Further, a part of the third layer 123 is removed, and a second recess R2 formed to protrude between the second layer 122 and the second interlayer insulating layer 130 may be formed. For example, a length of the second recess R2 in the horizontal direction DR1 may be formed to be greater than the length of the first recess R1 in the horizontal direction DR1.

Figure 9:
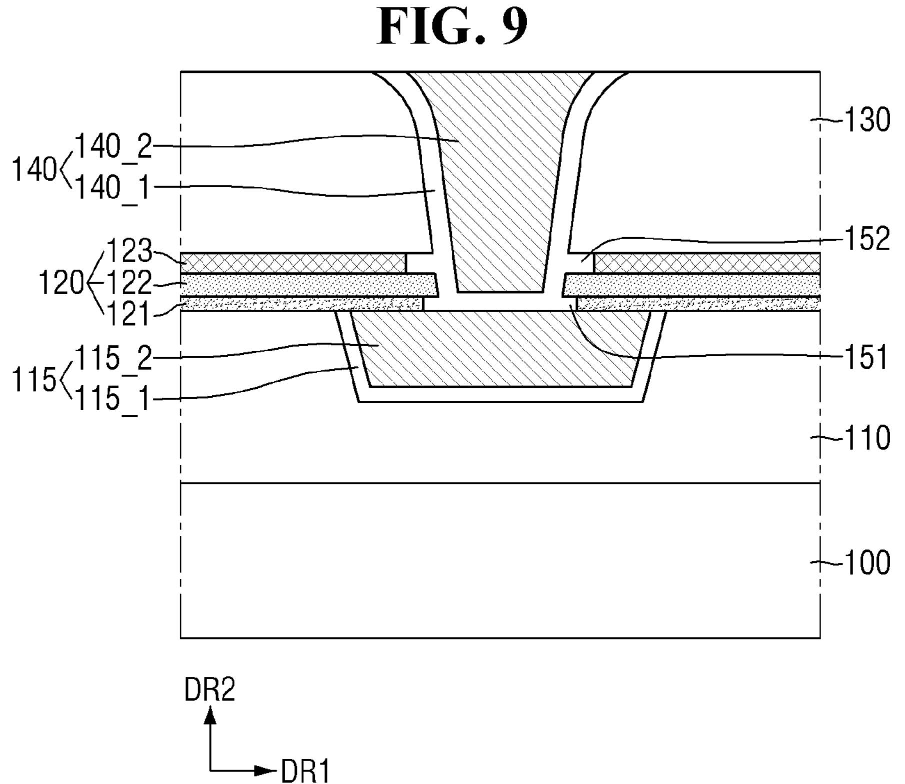

Referring to FIG. 9, the via 140 may be formed inside the via trench VT. Specifically, the second barrier layer 140_1 may be formed along the side walls and the bottom surface of the via trench VT. For example, the second barrier layer 140_1 may be conformally formed. For example, the second barrier layer 140_1 may fill the inside of each of the first recess R1 and the second recess R2. Subsequently, the second filling layer 140_1 may be formed to completely fill the via trench VT on the second barrier layer 140_1.

Figure 10:
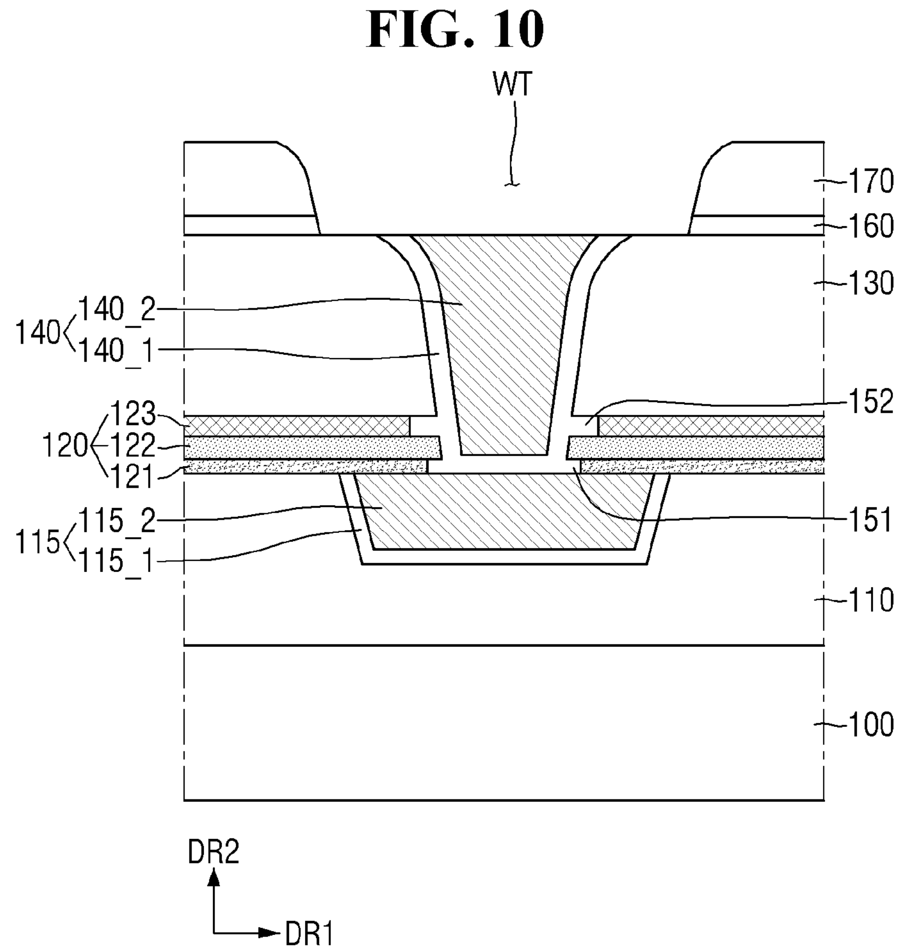

Referring to FIG. 10, the second etching stop layer 160 and the third interlayer insulating layer 170 may be sequentially formed on the second interlayer insulating layer 130 and the via 140. Subsequently, the upper wiring trench WT may be formed inside the second etching stop layer 160 and the third interlayer insulating layer 170. For example, the width of the upper wiring trench WT in the horizontal direction DR1 may be greater than the width of the via 140 in the horizontal direction DR1. A part of the second interlayer insulating layer 130 and the via 140 may be exposed by the upper wiring trench WT. For example, a part of the upper side wall of the upper wiring trench WT may be formed to have a curved surface toward the upper surface of the third interlayer insulating layer 170. However, embodiments are not limited thereto.

Referring to FIG. 1, a third barrier layer 180_1 may be formed along the side walls and a bottom surface of the upper wiring trench WT. For example, the third barrier layer 180_1 may be conformally formed. Subsequently, the third filling layer 180_2 may be formed to completely fill the upper wiring trench WT on the third barrier layer 180_1. The semiconductor device shown in FIG. 1 may be fabricated through such a fabricating process.

Hereinafter, a semiconductor device according to some other embodiments will be described referring to FIG. 11. Differences from the semiconductor device shown in FIGS. 1 and 2 will be mainly described.

Figure 11:
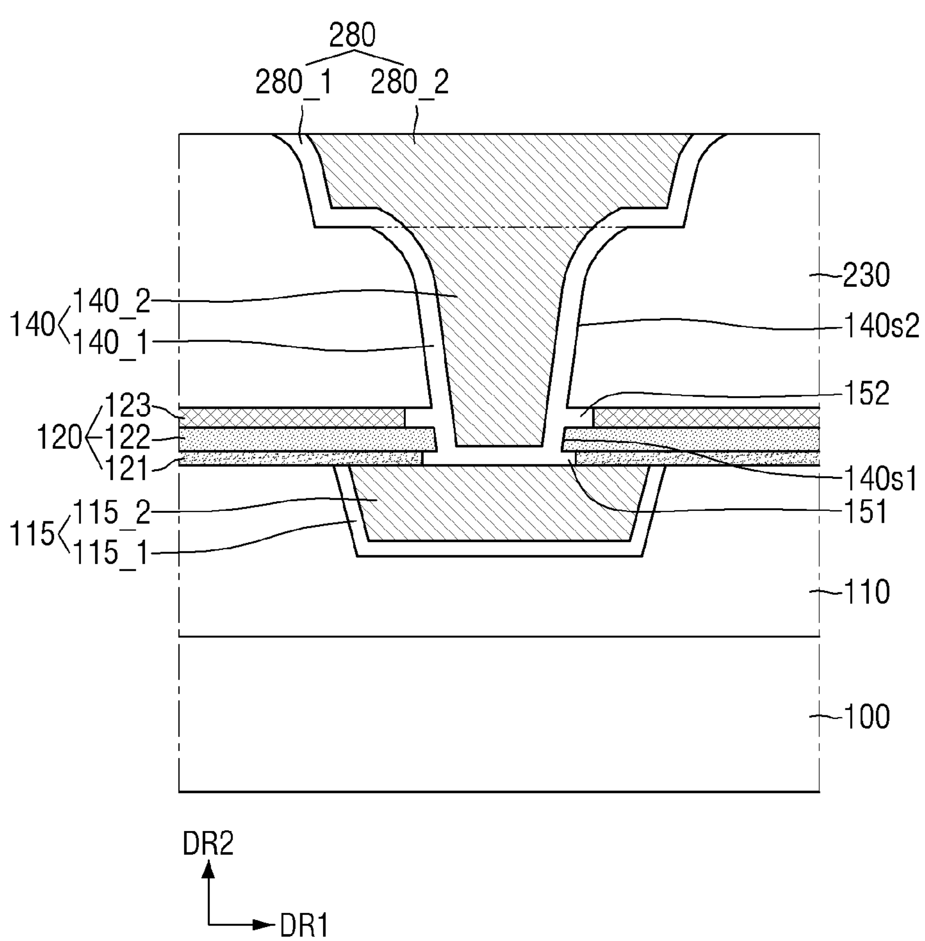
FIG. 11 is a cross-sectional view illustrating a semiconductor device according to some other embodiments.

FIG. 11 is a cross-sectional view illustrating a semiconductor device according to some other embodiments.

Referring to FIG. 11, the semiconductor device according to some other embodiments may have a structure in which the via 140 and the upper wiring 280 are formed by a dual damascene process.

For example, the upper wiring 280 may include a third barrier layer 280_1 that forms a part of the side walls and the bottom surface of the upper wiring 280, and a third filling layer 280_1 disposed on the third barrier layer 280_1. The third barrier layer 280_1 may be disposed continuously with the second barrier layer 140_1. The third filling layer 280_1 may be disposed on the second filling layer 140_2 and the third barrier layer 280_1. The third filling layer 280_2 may be in contact with the second filling layer 140_2. The second interlayer insulating layer 230 may be provided adjacent to and surround the side walls of each of the via 140 and the upper wiring 280 on the first etching stop layer 120.

Hereinafter, a semiconductor device according to still some other embodiments will be described referring to FIGS. 12 and 13. Differences from the semiconductor device shown in FIGS. 1 and 2 will be mainly described.

Figure 12:
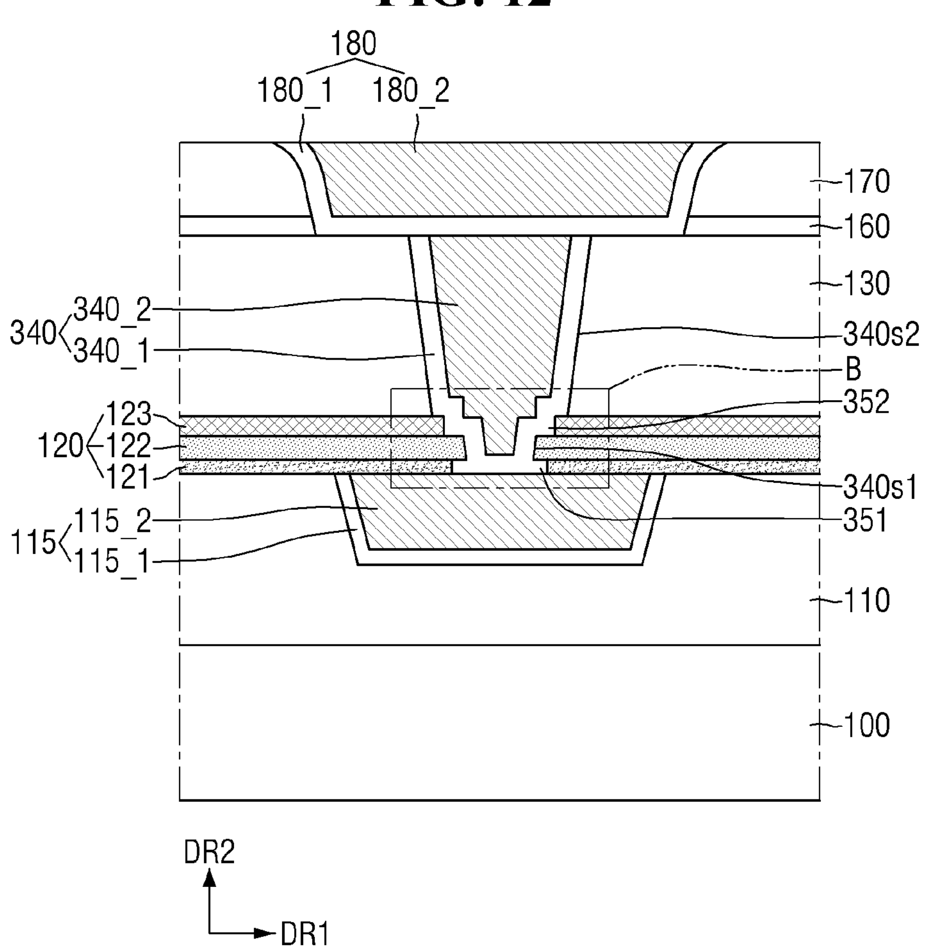
FIG. 12 is a cross-sectional view illustrating a semiconductor device according to still some other embodiments.

FIG. 12 is a cross-sectional view illustrating a semiconductor device according to still some other embodiments. FIG. 13 is an enlarged view of a region B of FIG. 12.

Figure 13:
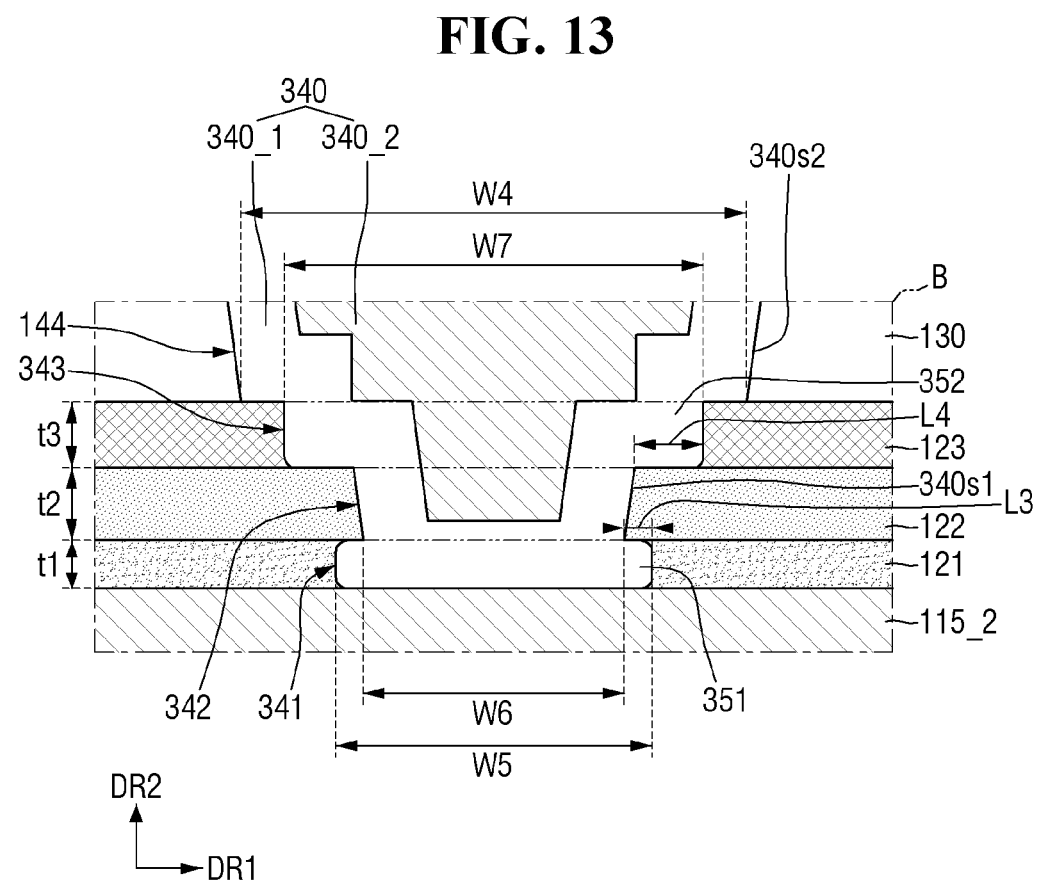

Referring to FIGS. 12 and 13, in the semiconductor device according to still some other embodiments, a width W7 in the horizontal direction DR1 of the third portion 343 of a via 340 may be smaller than the width W4 in the horizontal direction DR1 of the fourth portion 144 of the via 340 that is in contact with the third portion 343 of the via 340. The width W5 in the horizontal direction DR1 of the first portion 341 of the via 340 may be smaller than the width W4 in the horizontal direction DR1 of the fourth portion 144 of the via 340 that is in contact with the third portion 343 of the via 340.

Further, the width W5 in the horizontal direction DR1 of the first portion 341 of the via 340 may be greater than the width W6 in the horizontal direction DR1 of the second portion 342 of the via 340. The width W7 in the horizontal direction DR1 of the third portion 343 of the via 340 may be greater than the width W6 in the horizontal direction DR1 of the second portion 342 of the via 340. The width W7 in the horizontal direction DR1 of the third portion 343 of the via 340 may be greater than the width W5 in the horizontal direction DR1 of the first portion 341 of the via 340.

The via 340 may include a first side wall **340*s*1 that is in contact with the second layer 122 and a second side wall 340*s*2 that is in contact with the second interlayer insulating layer 130. The first portion 341 of the via 340 may include a first protrusion 351 that protrudes from the first side wall 340*s*1 of the via 340 in the horizontal direction DR1. An upper surface of the first protrusion 351 may be in contact with the second layer 122**.

The third portion 343 of the via 340 may include a second protrusion 352 that protrudes from the first side wall **340*s*1 of the via 340 in the horizontal direction DR1. A lower surface of the second protrusion 352 may be in contact with the second layer 122. At least a part of the fourth portion 144 of the via 340 may be in contact with the upper surface of the third layer 123**.

A length L3 of the first protrusion 351 in the horizontal direction DR1 may be smaller than a length L4 of the second protrusion 352 in the horizontal direction DR1. For example, the third length L3 in the horizontal direction DR1 from the first side wall **340*s*1 of the via 340 to the side wall of the first portion 341 of the via 340 may be smaller than the fourth length L4 in the horizontal direction DR1 from the first side wall 340*s*1 of the via 340 to the side wall of the third portion 343 of the via 340**.

The via 340 may include a second barrier layer 340_1 and a second filling layer 340_2. The second barrier layer 340_1 may form the side walls and bottom surface of the via 340. Each of the first protrusion 351 and the second protrusion 352 may include a second barrier layer 340_1. The second filling layer 340_2 may be disposed on the second barrier layer 340_1.

Hereinafter, a method for fabricating a semiconductor device according to still some other embodiments will be described referring to FIGS. 12 and 14 to 21.

FIGS. 14 to 21 are intermediate step diagrams illustrating the method for fabricating the semiconductor device shown in FIGS. 12 and 13.

Figure 14:
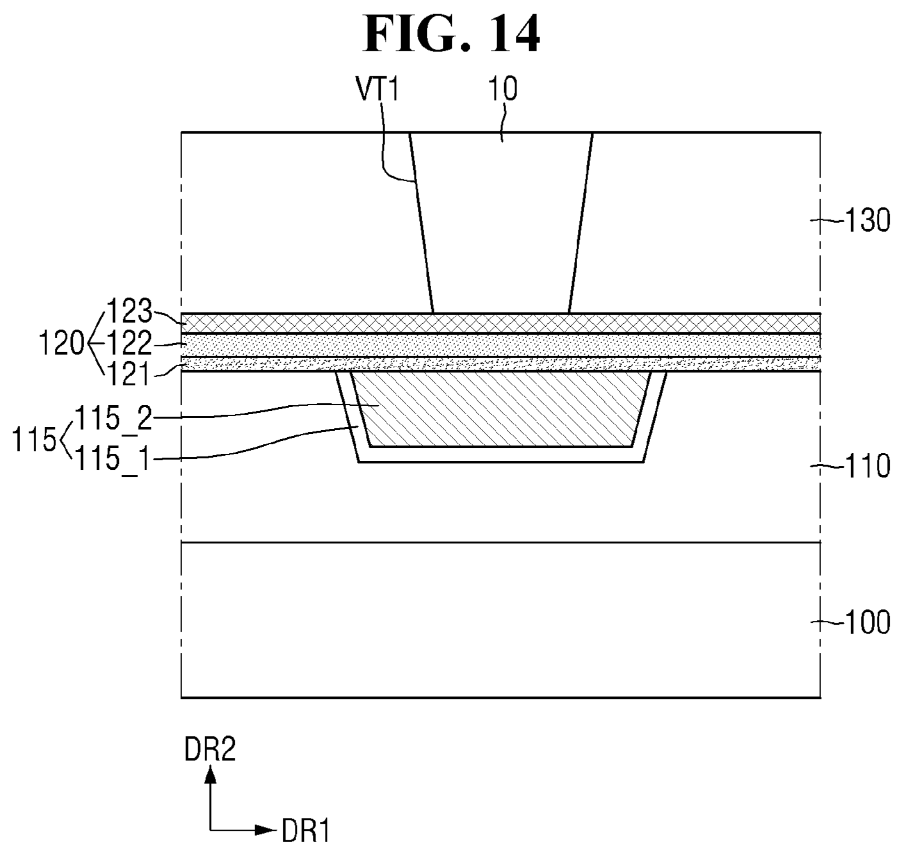
FIGS. 14, 15, 16, 17, 18, 19, 20, and 21 are intermediate step diagrams illustrating the method for fabricating the semiconductor device shown in FIGS. 12 and 13.

Referring to FIG. 14, after the fabricating processes shown in FIGS. 3 to 5 are sequentially performed, the first mask pattern (M1 of FIG. 5) may be removed. Further, the sacrificial layer 10 may be formed inside the first via trench VT1. For example, the sacrificial layer 10 may completely fill the inside of the first via trench VT1. For example, the upper surface of the sacrificial layer 10 may be coplanar as the upper surface of the second interlayer insulating layer 130.

Figure 15:
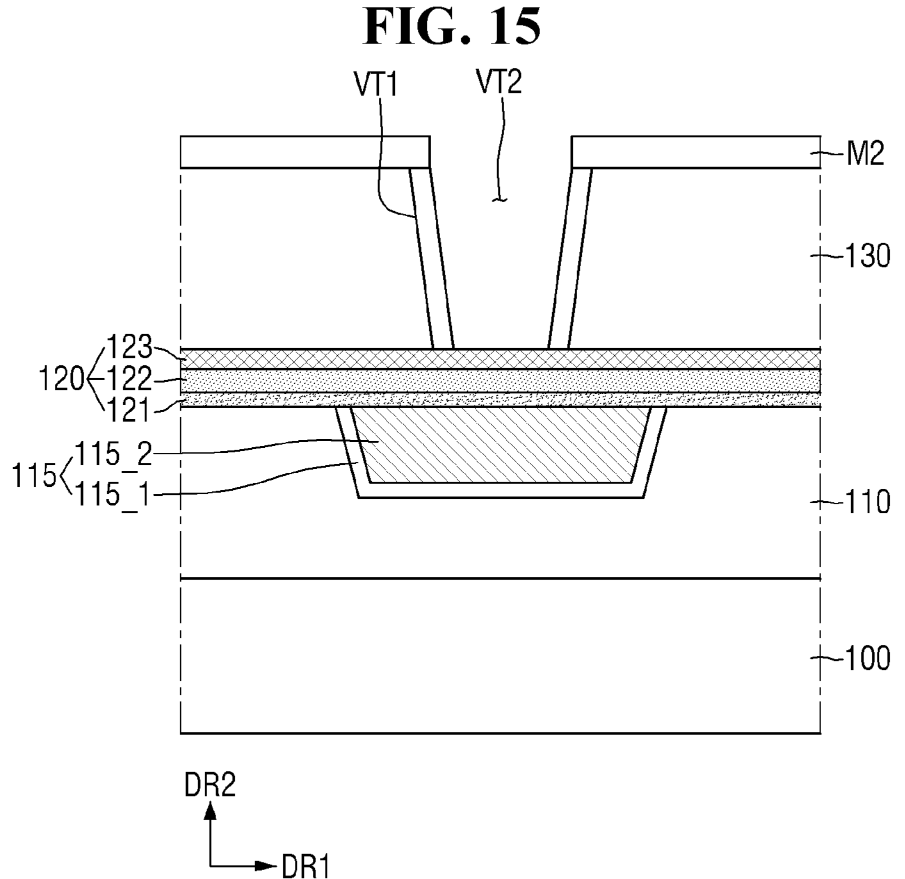

Referring to FIG. 15, the second mask pattern M2 may be formed on the second interlayer insulating layer 130. The second mask pattern M2 may also be formed on a part of the sacrificial layer 10 adjacent to the second interlayer insulating layer 130. Next, by etching the sacrificial layer 10 using the second mask pattern M2 as a mask, a second via trench VT2 may be formed. The second via trench VT2 may expose the upper surface of the third layer 123.

Figure 16:
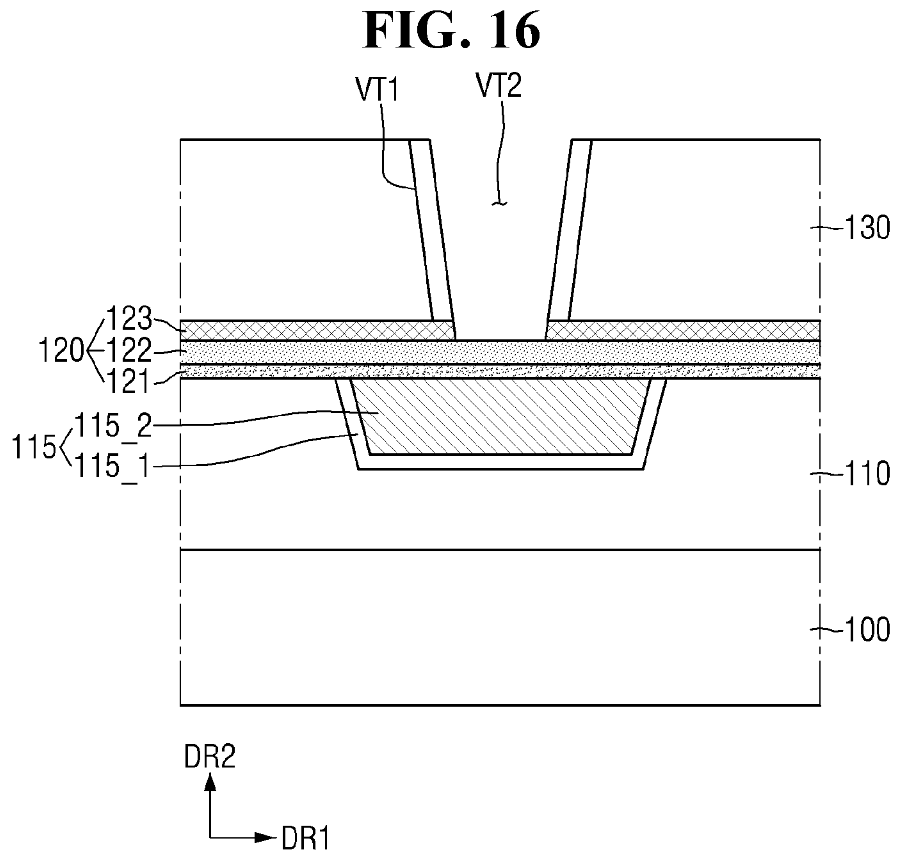

Referring to FIG. 16, the second mask pattern M2 may be removed. Further, the third layer 123 exposed by the second via trench VT2 may be removed.

Figure 17:
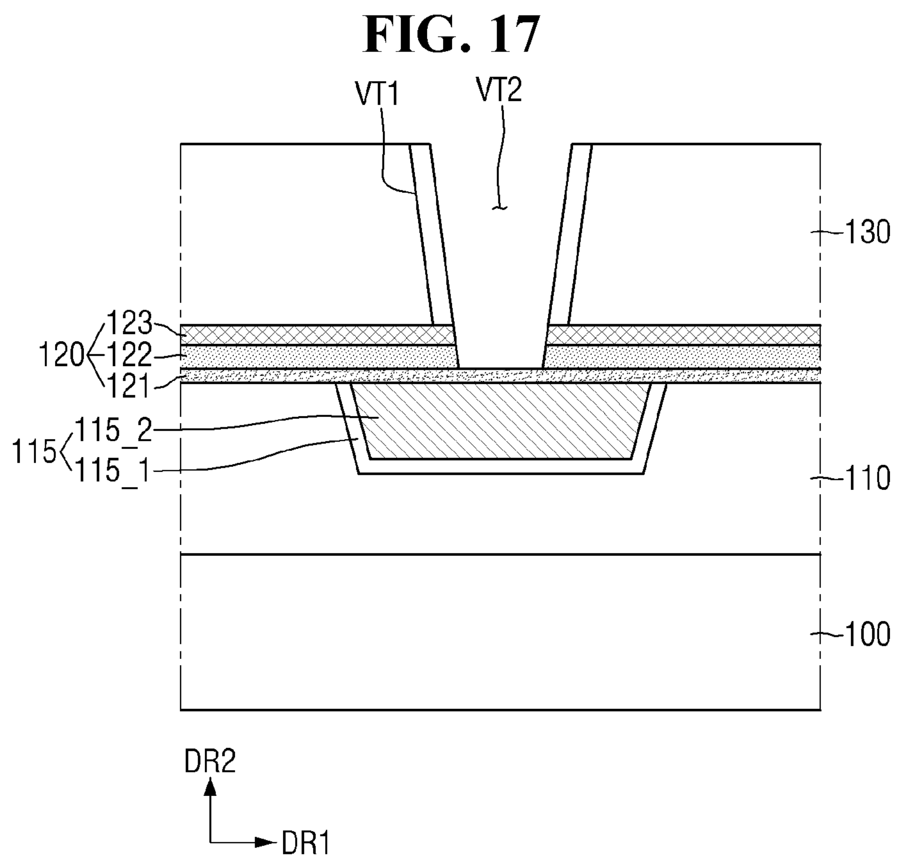

Referring to FIG. 17, the second layer 122 exposed by the second via trench VT2 may be removed.

Figure 18:
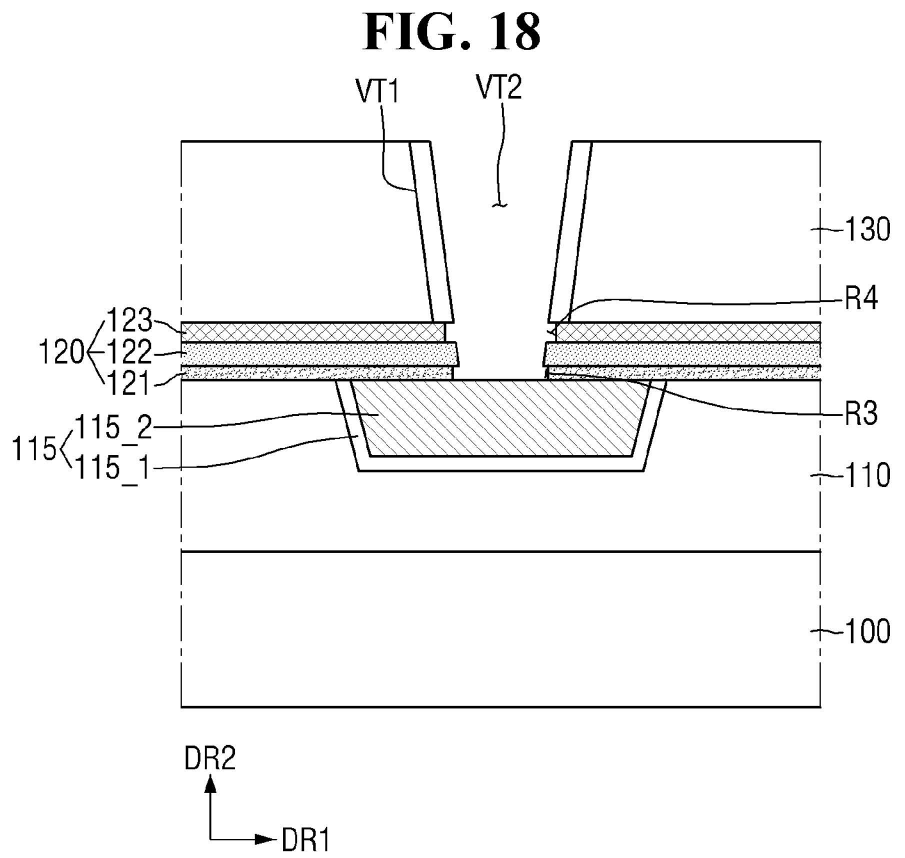

Referring to FIG. 18, a part of the first layer 121 and a part of the third layer 123 exposed by the second via trench VT2 may be removed through, for example, the wet etching process. A part of the first layer 121 is removed, and the lower wiring 115 may be exposed by the second via trench VT2. A part of the first layer 121 is removed, and a third recess R3 formed to enter between the lower wiring 115 and the second layer 122 may be formed. Further, a part of the third layer 123 is removed, and a fourth recess R4 formed to protrude between the second layer 122 and the sacrificial layer 10 may be formed. For example, a length of the fourth recess R4 in the horizontal direction DR1 may be formed to be greater than a length of the third recess R3 in the horizontal direction DR1.

Figure 19:
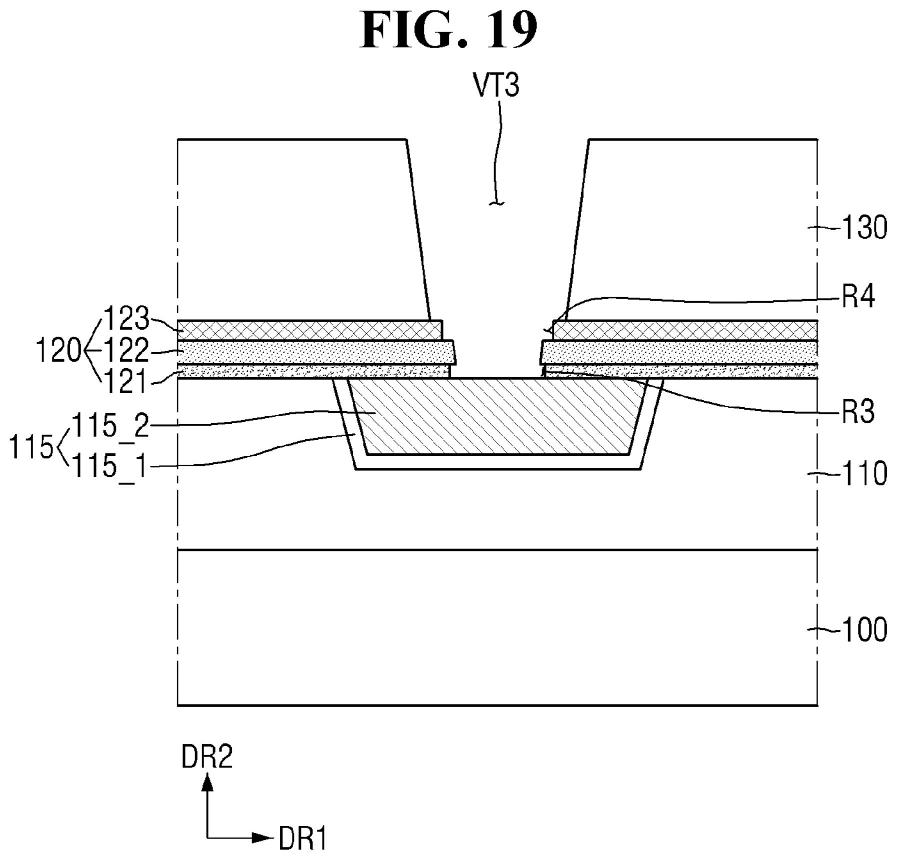

Referring to FIG. 19, the sacrificial layer 10 formed on the side wall of the first via trench (VT1 of FIG. 18) may be removed. As a result, the third via trench VT3 may be formed inside the first etching stop layer 120 and the second interlayer insulating layer 130.

Figure 20:
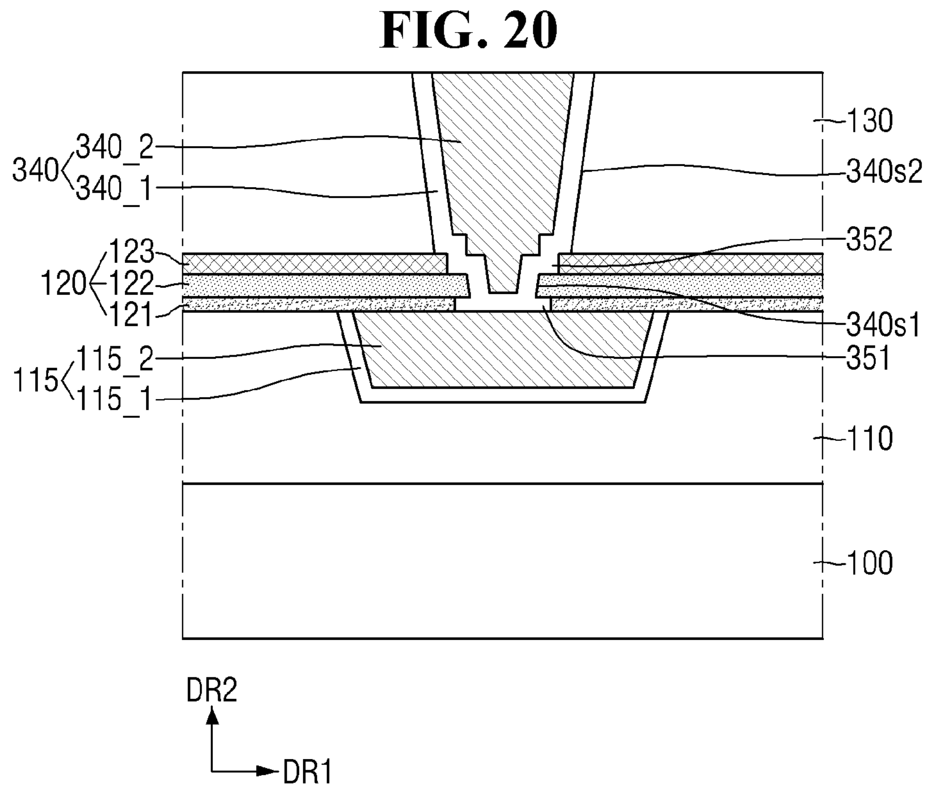

Referring to FIG. 20, the via 340 may be formed inside the third via trench (VT3 of FIG. 19). For example, the second barrier layer 340_1 may be formed along the side walls and the bottom surface of the third via trench (VT3 of FIG. 19). For example, the second barrier layer 340_1 may be conformally formed. For example, the second barrier layer 340_1 may fill the inside of the third recess (R3 of FIG. 19) to form the first protrusion 351. Further, the second barrier layer 340_1 may fill the inside of the fourth recess (R4 of FIG. 19) to form the second protrusion 352. Subsequently, the second filling layer 340_2 may be formed on the second barrier layer 340_1 to completely fill the third via trench (VT3 of FIG. 19).

Figure 21:
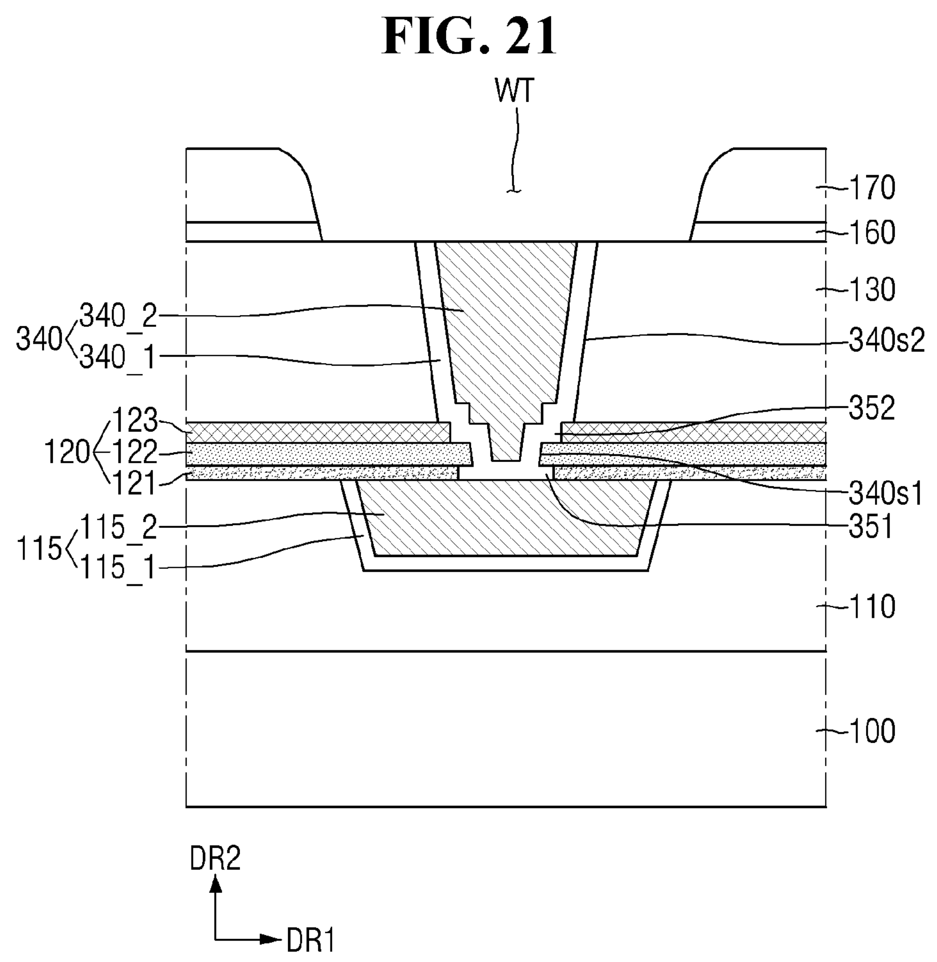

Referring to FIG. 21, the second etching stop layer 160 and the third interlayer insulating layer 170 may be sequentially formed on the second interlayer insulating layer 130 and the via 340. Subsequently, the upper wiring trench WT may be formed inside the second etching stop layer 160 and the third interlayer insulating layer 170. For example, the width of the upper wiring trench WT in the horizontal direction DR1 may be greater than the width of the via 340 in the horizontal direction DR1. A part of the second interlayer insulating layer 130 and the via 340 may be exposed by the upper wiring trench WT. For example, a part of the upper side wall of the upper wiring trench WT may be formed to have a curved surface toward the upper surface of the third interlayer insulating layer 170. However, embodiments are not limited thereto.

Referring to FIG. 12, a third barrier layer 180_1 may be formed along the side walls and bottom surface of the upper wiring trench WT. For example, the third barrier layer 180_1 may be conformally formed. Subsequently, the third filling layer 180_2 may be formed to completely fill the upper wiring trench WT on the third barrier layer 180_1. The semiconductor device shown in FIG. 12 may be fabricated through such a fabricating process.

Hereinafter, a semiconductor device according to still some other embodiments will be described referring to FIGS. 22 and 23. Differences from the semiconductor device shown in FIGS. 1 and 2 will be mainly described.

Figure 22:
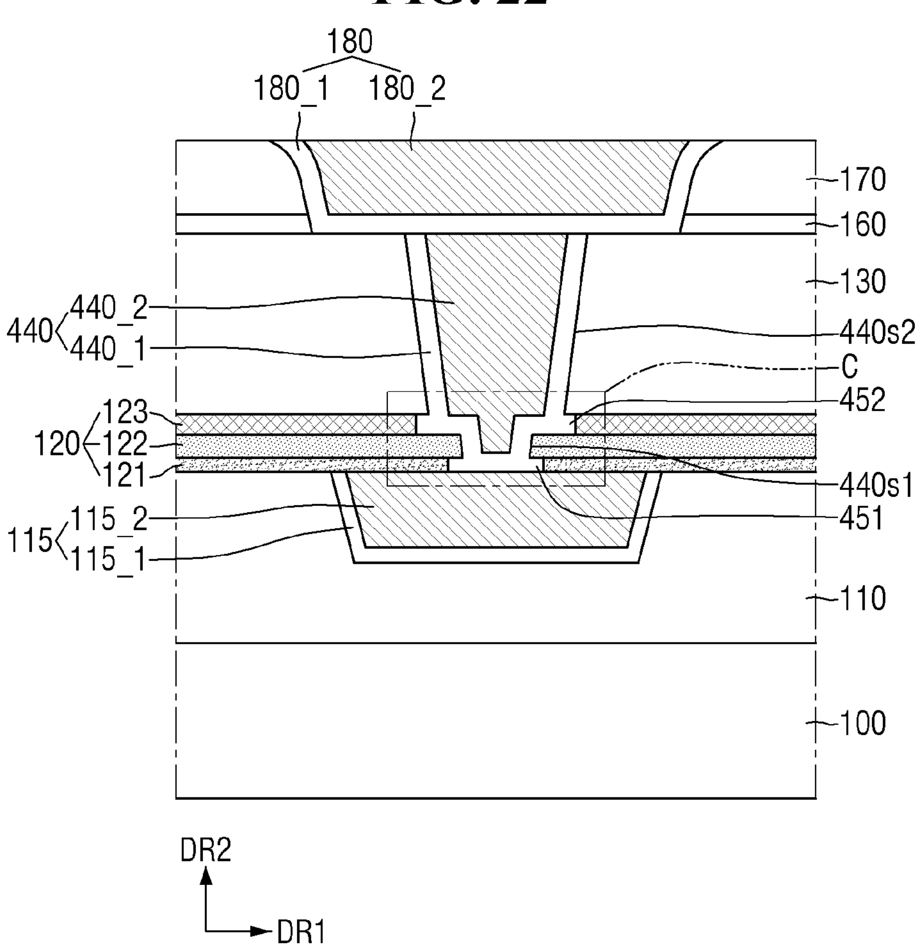
FIG. 22 is a cross-sectional view illustrating a semiconductor device according to still some other embodiments.

FIG. 22 is a cross-sectional view illustrating a semiconductor device according to still some other embodiments. FIG. 23 is an enlarged view of a region C of FIG. 22.

Figure 23:
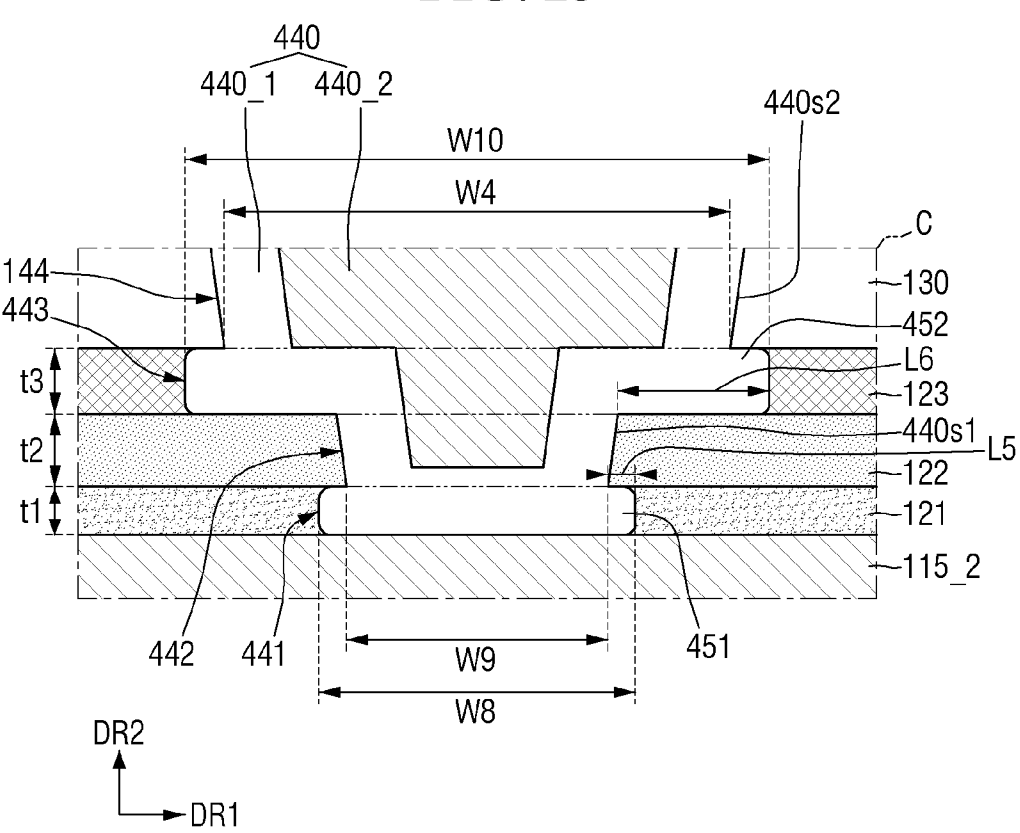
FIG. 23 is an enlarged view of a region C of FIG. 22.

Referring to FIGS. 22 and 23, in the semiconductor device according to still some other embodiments, a width W8 in the horizontal direction DR1 of the first portion 441 of the via 440 may be smaller than the width W4 in the horizontal direction DR1 of the fourth portion 144 of the via 440 that is in contact with the third portion 443 of the via 440.

Further, a width W10 in the horizontal direction DR1 of the third portion 443 of the via 440 may be greater than the width W4 in the horizontal direction DR1 of the fourth portion 144 of the via 440 that is in contact with the third portion 443 of the via 440. The width W8 in the horizontal direction DR1 of the first portion 441 of the via 440 may be greater than the width W9 in the horizontal direction DR1 of the second portion 442 of the via 440. The width W10 in the horizontal direction DR1 of the third portion 443 of the via 440 may be greater than the width W9 in the horizontal direction DR1 of the second portion 442 of the via 440. The width W10 in the horizontal direction DR1 of the third portion 443 of the via 440 may be greater than the width W8 in the horizontal direction DR1 of the first portion 441 of the via 440.

The via 440 may include a first side wall **440*s*1 that is in contact with the second layer 122, and a second side wall 440*s*2 that is in contact with the second interlayer insulating layer 130. The first portion 441 of the via 440 may include a first protrusion 451 that protrudes from the first side wall 440*s*1 of the via 440 in the horizontal direction DR1. The upper surface of the first protrusion 451 may be in contact with the second layer 122**.

The third portion 443 of the via 440 may include a second protrusion 452 that protrudes from the first side wall **440*s*1 of the via 440 in the horizontal direction DR1. A lower surface of the second protrusion 452 may be in contact with the second layer 122. At least a part of the upper surface of the third portion 443 of the via 440 may be in contact with the second interlayer insulating layer 130**.

A length L5 of the first protrusion 451 in the horizontal direction DR1 may be smaller than a length L6 of the second protrusion 452 in the horizontal direction DR1. For example, the fifth length L5 in the horizontal direction DR1 from the first side wall **440*s*1 of the via 440 to the side wall of the first portion 441 of the via 440 may be smaller than the sixth length L6 in the horizontal direction DR1 from the first side wall 440*s*1 of the via 440 to the side wall of the third portion 443 of the via 440**.

The via 440 may include a second barrier layer 440_1 and a second filling layer 440_2. The second barrier layer 440_1 may form the side walls and bottom surface of the via 440. Each of the first protrusion 451 and the second protrusion 452 may include a second barrier layer 440_1. The second filling layer 440_2 may be disposed on the second barrier layer 440_1.

Hereinafter, a semiconductor device according to still some other embodiments will be described referring to FIGS. 22 and 24 to 27.

FIGS. 24 to 27 are intermediate step diagrams illustrating the method for fabricating the semiconductor device shown in FIGS. 22 and 23.

Figure 24:
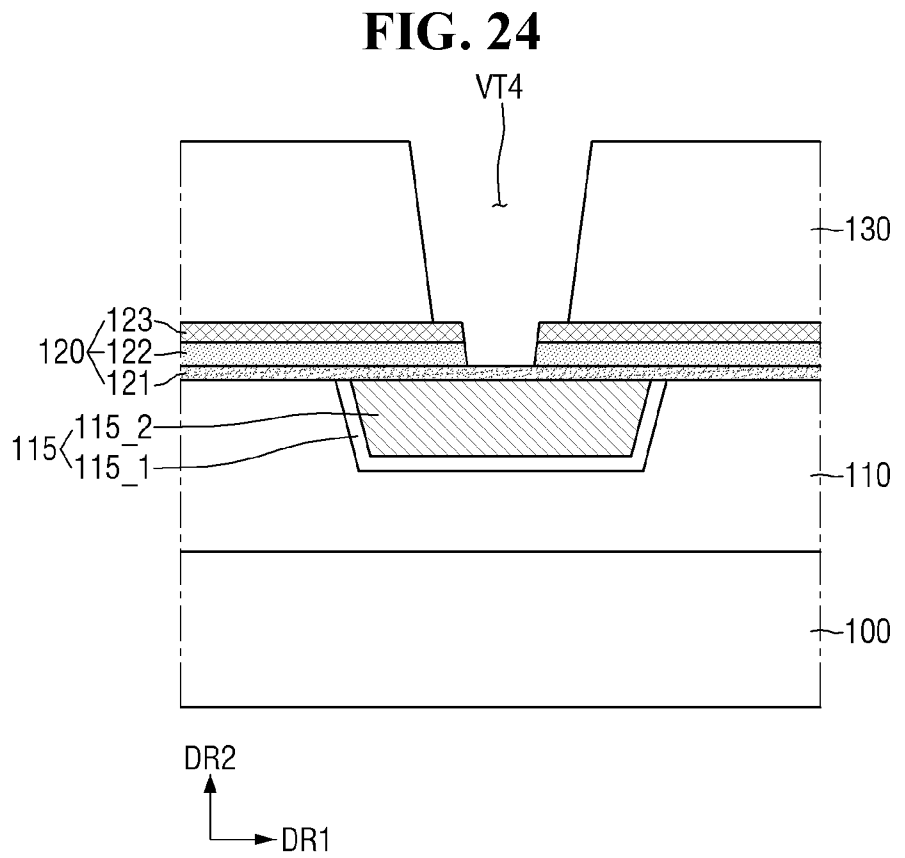
FIGS. 24, 25, 26, and 27 are intermediate step diagrams illustrating the method for fabricating the semiconductor device shown in FIGS. 22 and 23.

Referring to FIG. 24, after the fabricating processes shown in FIGS. 3 to 5 and 14 to 17 are sequentially performed, the sacrificial layer 10 formed on the side wall of the first via trench (VT1 of FIG. 17) may be removed. As a result, the fourth via trench VT4 may be formed inside the second layer 122, the third layer 123, and the second interlayer insulating layer 130. The upper surface of the first layer 121 may be exposed by the fourth via trench VT4.

Figure 25:
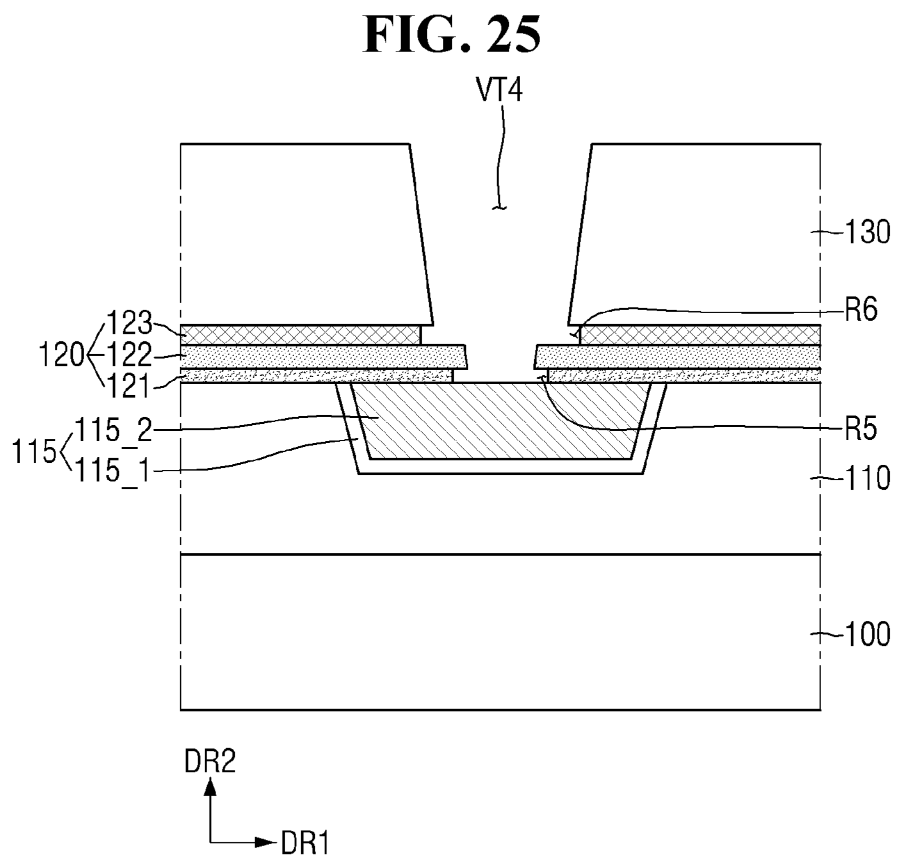

Referring to FIG. 25, a part of the first layer 121 and a part of the third layer 123 exposed to the fourth via trench VT4 may be removed through the wet etching process. A part of the first layer 121 is removed, and the lower wiring 115 may be exposed by the fourth via trench VT4. A part of the first layer 121 is removed, and a fifth recess R5 formed to enter between the lower wiring 115 and the second layer 122 may be formed. Further, a part of the third layer 123 is removed, and a sixth recess R6 formed to enter between the second layer 122 and the second interlayer insulating layer 130 may be formed. For example, the length of the sixth recess R6 in the horizontal direction DR1 may be formed to be greater than the length of the fifth recess R5 in the horizontal direction DR1.

Figure 26:
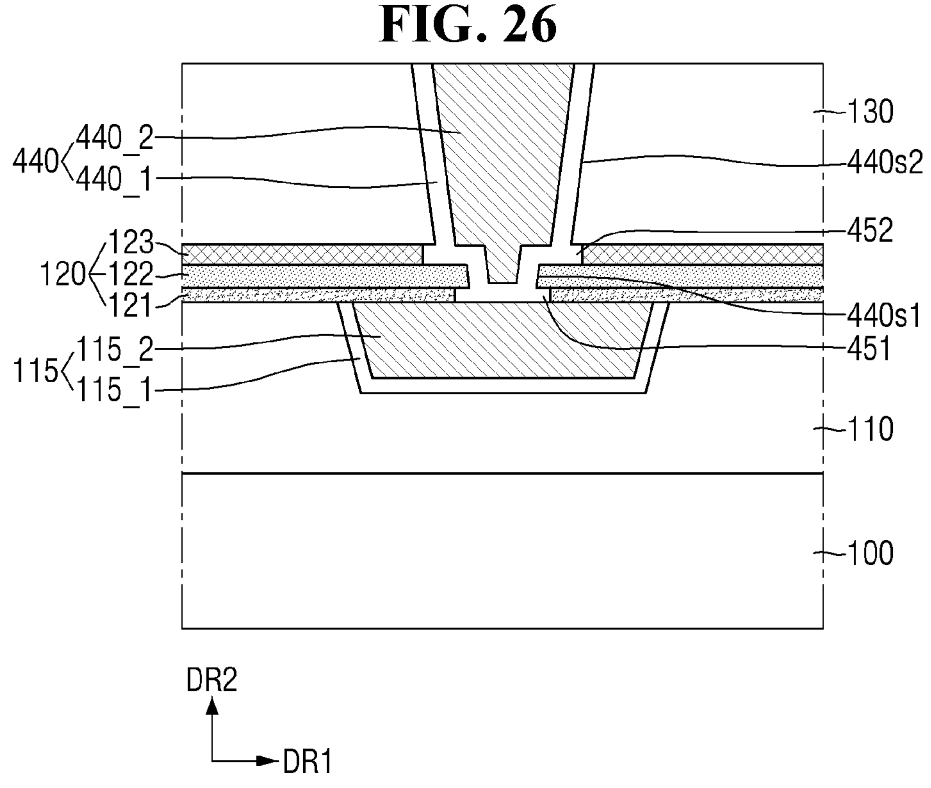

Referring to FIG. 26, a via 440 may be formed inside the fourth via trench (VT4 of FIG. 25). For example, the second barrier layer 440_1 may be formed along the side walls and the bottom surface of the fourth via trench (VT4 of FIG. 25). For example, the second barrier layer 440_1 may be conformally formed. For example, the second barrier layer 440_1 may fill the inside of the fifth recess (R5 of FIG. 25) to form the first protrusion 451. Further, the second barrier layer 440_1 may fill the inside of the sixth recess (R6 of FIG. 25) to form the second protrusion 452. Next, the second filling layer 440_2 may be formed on the second barrier layer 440_1 to completely fill the fourth via trench (VT4 of FIG. 25).

Figure 27:
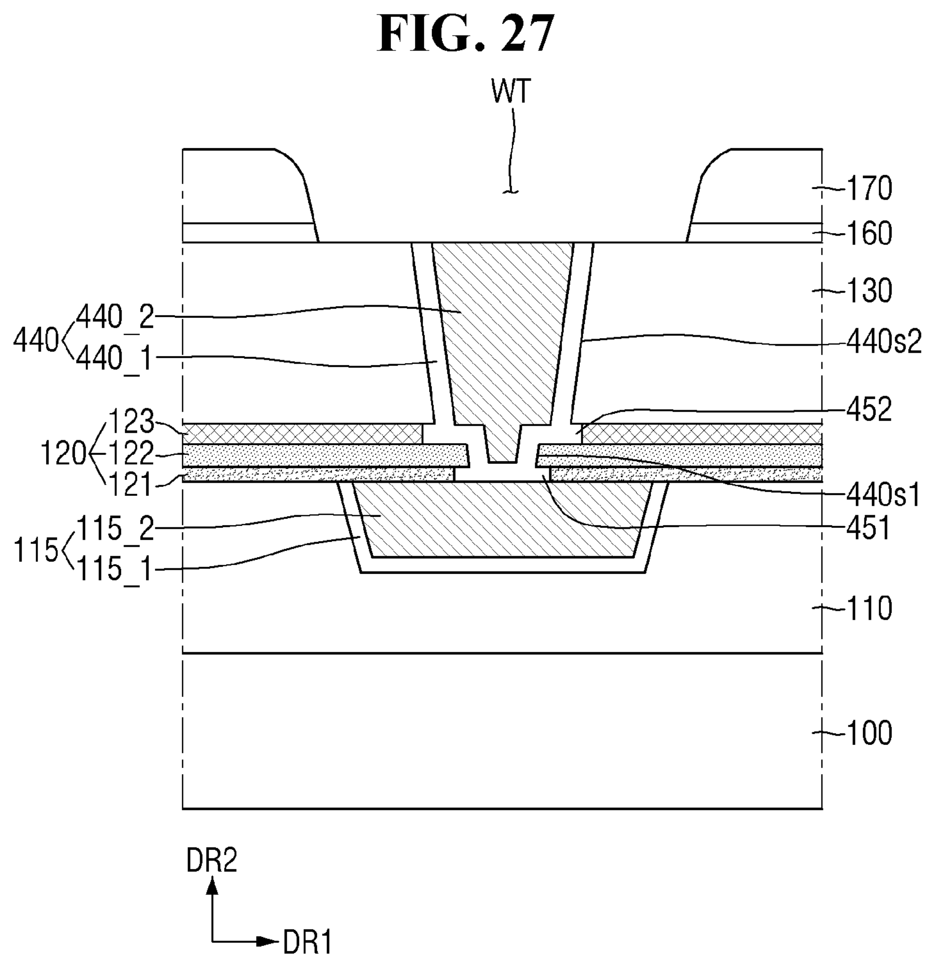

Referring to FIG. 27, the second etching stop layer 160 and the third interlayer insulating layer 170 may be sequentially formed on the second interlayer insulating layer 130 and the via 440. Subsequently, the upper wiring trench WT may be formed inside the second etching stop layer 160 and the third interlayer insulating layer 170. For example, the width of the upper wiring trench WT in the horizontal direction DR1 may be greater than the width of the via 440 in the horizontal direction DR1. A part of the second interlayer insulating layer 130 and the via 440 may be exposed by the upper wiring trench WT. For example, a part of the upper side wall of the upper wiring trench WT may be formed to have a curved surface toward the upper surface of the third interlayer insulating layer 170. However, embodiments are not limited thereto.

Referring to FIG. 22, the third barrier layer 180_1 may be formed along the side walls and bottom surface of the upper wiring trench WT. For example, the third barrier layer 180_1 may be conformally formed. Subsequently, the third filling layer 180_2 may be formed to completely fill the upper wiring trench WT on the third barrier layer 180_1. The semiconductor device shown in FIG. 22 may be fabricated through such a fabricating process.

While the present disclosure has been described with reference to embodiments thereof, it will be apparent to those of ordinary skill in the art that various changes and modifications may be made thereto without departing from the spirit and scope of the present disclosure as set forth in the following claims and their equivalents.

What is claimed is:

1. A semiconductor device comprising:

a first interlayer insulating layer;

a lower wiring disposed inside the first interlayer insulating layer, the lower wiring comprising a filling layer and a barrier layer;

an etching stop layer disposed on the first interlayer insulating layer, the etching stop layer comprising a first layer, a second layer, and a third layer;

a second interlayer insulating layer disposed on the etching stop layer; and a via penetrating the second interlayer insulating layer and the etching stop layer and being connected to the lower wiring, the via comprising:

a first side wall that is in contact with the second layer;

a second side wall that is in contact with the second interlayer insulating layer;

a first barrier layer comprising side liner portions including the first side wall of the via and the second side wall of the via and a bottom portion including a bottom surface of the via;

wherein the first barrier layer further comprises a first protrusion protruding in a horizontal direction from a level of the first side wall that contacts the second layer toward the first layer, and a second protrusion protruding in the horizontal direction from the level of the first side wall that contacts the second layer toward the third layer, wherein a portion of the first layer of the etching stop layer and the bottom portion of the first barrier layer contact the filling layer.

2. The semiconductor device of claim 1, wherein a first length of the first protrusion in the horizontal direction is smaller than a second length of the second protrusion in the horizontal direction.

3. The semiconductor device of claim 1, wherein an upper surface of the first protrusion and a lower surface of the second protrusion are in contact with the second layer.

4. The semiconductor device of claim 1, wherein an upper surface of the second protrusion is in contact with the second interlayer insulating layer.

5. The semiconductor device of claim 1, wherein the second protrusion protrudes in the horizontal direction from a level of the second side wall contacting the second interlayer insulating layer of the via toward the third layer.

6. The semiconductor device of claim 1, wherein at least a part of the via disposed inside the second interlayer insulating layer is in contact with an upper surface of the third layer.

7. The semiconductor device of claim 1, further comprising:

an upper wiring disposed on the via and connected to the via, wherein the via further comprises a first filling layer disposed on the first barrier layer, wherein the upper wiring comprises a second barrier layer that forms side walls and a bottom surface of the upper wiring, and a second filling layer disposed on the second barrier layer, and wherein the second barrier layer is disposed between the first filling layer and the second filling layer.

8. The semiconductor device of claim 1, further comprising:

an upper wiring disposed on the via and connected to the via, wherein the via comprises a first filling layer disposed on the first barrier layer, wherein the upper wiring comprises a second barrier layer that forms a part of the side walls and the bottom surface of the upper wiring, and a second filling layer disposed on the second barrier layer, and wherein the first filling layer is in contact with the second filling layer.

9. The semiconductor device of claim 1, wherein a thickness of the third layer is greater than a thickness of the first layer.

10. The semiconductor device of claim 1, wherein a thickness of the second layer is greater than a thickness of the third layer.

11. The semiconductor device of claim 1, wherein a thickness of the first layer ranges from 10 Å to 50 Å, wherein a thickness of the second layer ranges from 10 Å to 100 Å, and wherein a thickness of the third layer ranges from 10 Å to 50 Å.

12. The semiconductor device of claim 1, wherein each of the first layer and the third layer comprises an aluminum compound, and wherein the second layer comprises one of silicon oxycarbide (SiOC), silicon carbide (SiC), and silicon oxide ($SiO_2$).

13. A semiconductor device comprising:

a first interlayer insulating layer;

a lower wiring disposed inside the first interlayer insulating layer, the lower wiring comprising a filling layer and a barrier layer;

an etching stop layer disposed on the first interlayer insulating layer, the etching stop layer comprising a first layer, a second layer, and a third layer;

a second interlayer insulating layer disposed on the etching stop layer; and a via comprising a first portion disposed inside the first layer, a second portion disposed inside the second layer, a third portion disposed inside the third layer, and a fourth portion disposed inside the second interlayer insulating layer, the via comprising a first filling layer, wherein a width of the third portion in a horizontal direction is greater than a width of the first portion in the horizontal direction, wherein the width of the first portion in the horizontal direction is greater than a width of the second portion in the horizontal direction, wherein each of at least a part of an upper surface of the first portion and at least a part of a lower surface of the third portion is in contact with the second layer, wherein the via further comprises a first barrier layer comprising side portions on side walls of the first filling layer and a bottom portion on a bottom surface of the first filling layer, and wherein a portion of the first layer of the etching stop layer and the bottom portion of the first barrier layer contact the filling layer.

14. The semiconductor device of claim 13, wherein a first length in the horizontal direction from a side wall of the second portion to a side wall of the first portion is smaller than a second length in the horizontal direction from the side wall of the second portion to a side wall of the third portion.

15. The semiconductor device of claim 13, wherein the width in the horizontal direction of the first portion is greater than a width in the horizontal direction of the fourth portion, the fourth portion contacting the third portion.

16. The semiconductor device of claim 13, wherein the width in the horizontal direction of the first portion is smaller than a width in the horizontal direction of the fourth portion that is in contact with the third portion.

17. The semiconductor device of claim 13, wherein the width in the horizontal direction of the third portion is greater than a width in the horizontal direction of the fourth portion, the fourth portion contacting the third portion.

18. The semiconductor device of claim 13, wherein the width in the horizontal direction of the third portion is smaller than a width in the horizontal direction of the fourth portion.

19. The semiconductor device of claim 13, wherein a thickness of the third layer is greater than a thickness of the first layer, and wherein a thickness of the second layer is greater than the thickness of the third layer.

20. A semiconductor device comprising:

a substrate;

a first interlayer insulating layer disposed on the substrate;

a lower wiring disposed inside the first interlayer insulating layer, the lower wiring comprising a filling layer and a barrier layer;

an etching stop layer disposed on the first interlayer insulating layer, the etching stop layer comprising a first layer, a second layer, and a third layer, each of the first layer, the second layer, and the third layer comprising an aluminum compound, a second interlayer insulating layer disposed on the etching stop layer;

a via penetrating the second interlayer insulating layer and the etching stop layer and being connected to the lower wiring, the via comprising a first portion disposed inside the first layer, a second portion disposed inside the second layer, a third portion disposed inside the third layer, a fourth portion disposed inside the second interlayer insulating layer, a first protrusion protruding in a horizontal direction from a level of a side wall of the second portion that contacts the second layer toward the first layer, and a second protrusion protruding in the horizontal direction from the level of a side wall of the second portion that contacts the second layer toward the third layer, the via comprising a first filling layer; and an upper wiring disposed on the via and connected to the via, a width of the upper wiring in the horizontal direction being greater than a width of the via in the horizontal direction, wherein a first length of the first protrusion in the horizontal direction is smaller than a second length of the second protrusion in the horizontal direction, wherein each of an upper surface of the first protrusion and a lower surface of the second protrusion is in contact with the second layer, wherein an upper surface of the second protrusion is in contact with the second interlayer insulating layer, wherein the via further comprises a first barrier layer comprising side portions on side walls of the first filling layer and a bottom portion on a bottom surface of the first filling layer, and wherein a portion of the first layer of the etching stop layer and the bottom portion of the first barrier layer contact the filling layer.

* * * * *